(12) United States Patent
Nakahashi et al.

(10) Patent No.: US 8,773,221 B2
(45) Date of Patent: Jul. 8, 2014

(54) BAND REJECTION FILTER

(75) Inventors: Norihiko Nakahashi, Ishikawa-gun (JP); Yasumasa Taniguchi, Kaga (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 773 days.

(21) Appl. No.: 12/978,673

(22) Filed: Dec. 27, 2010

(65) Prior Publication Data

US 2011/0090026 A1  Apr. 21, 2011

Related U.S. Application Data

(63) Continuation of application No. PCT/JP2009/002243, filed on May 21, 2009.

(30) Foreign Application Priority Data

Jun. 30, 2008 (JP) ................. 2008-170565

(51) Int. Cl.
*H03H 9/64* (2006.01)
*H03H 9/145* (2006.01)
*H03H 7/01* (2006.01)

(52) U.S. Cl.
CPC ......... *H03H 9/14594* (2013.01); *H03H 9/6409* (2013.01); *H03H 9/6483* (2013.01); *H03H 2007/013* (2013.01); *H03H 9/6486* (2013.01)
USPC .......................................... 333/195; 333/193

(58) Field of Classification Search
CPC .......... H03H 9/14547; H03H 9/14594; H03H 9/6406; H03H 9/6409; H03H 9/6423; H03H 9/6483; H03H 9/6486; H03H 2007/013

USPC ........... 333/193–196, 133; 310/313 B, 313 D
See application file for complete search history.

(56) References Cited

U.S. PATENT DOCUMENTS

| | | | | |
|---|---|---|---|---|
| 5,654,680 A | * | 8/1997 | Kwan et al. | 333/195 |
| 5,726,610 A | * | 3/1998 | Allen et al. | 333/133 |
| 7,804,384 B2 | * | 9/2010 | Shibahara | 333/193 |
| 8,242,861 B2 | * | 8/2012 | Yata | 333/193 |

(Continued)

FOREIGN PATENT DOCUMENTS

| | | |
|---|---|---|
| EP | 1 610 460 A1 | 12/2005 |
| EP | 1 804 377 A2 | 7/2007 |

(Continued)

OTHER PUBLICATIONS

English language machine translation of JP 7-283688, published Oct. 27, 1995, 4 pages.*

(Continued)

*Primary Examiner* — Barbara Summons
(74) *Attorney, Agent, or Firm* — Keating & Bennett, LLP

(57) ABSTRACT

An inexpensive compact band rejection filter realizes a high sharpness of a filter characteristic at ends of passbands and has a large attenuation. In the band rejection filter, at least one of a plurality of elastic wave resonators, which contributes to formation of a transition band, has a propagation angle larger than those of the other elastic wave resonators. Accordingly, the at least one of the plurality of elastic wave resonators which contributes to the formation of the transition band has an electromechanical coupling coefficient that is smaller than electromechanical coupling coefficients of the other elastic wave resonators.

22 Claims, 15 Drawing Sheets

(56) References Cited

U.S. PATENT DOCUMENTS

| | | |
|---|---|---|
| 2004/0051601 A1 | 3/2004 | Frank |
| 2004/0227587 A1 | 11/2004 | Inoue et al. |
| 2005/0099244 A1 | 5/2005 | Nakamura et al. |
| 2007/0090898 A1 | 4/2007 | Kando |
| 2008/0169886 A1 | 7/2008 | Kuroda |
| 2009/0128260 A1* | 5/2009 | Block et al. ............ 333/187 |
| 2009/0256649 A1* | 10/2009 | Taniguchi ............... 333/186 |

FOREIGN PATENT DOCUMENTS

| | | | |
|---|---|---|---|
| EP | 1 976 116 | * | 10/2008 |
| JP | 6-268475 A | | 9/1994 |
| JP | 7-283688 A | | 10/1995 |
| JP | 10-65489 | * | 3/1998 |
| JP | 10-65490 A | | 3/1998 |
| JP | 11-346141 | * | 12/1999 |
| JP | 2003-332881 | * | 11/2003 |
| JP | 2004-104799 A | | 4/2004 |
| JP | 2004-129238 A | | 4/2004 |
| JP | 2004-135322 | * | 4/2004 |
| JP | 3827232 B2 | | 9/2006 |
| WO | 2004/070946 A1 | | 8/2004 |
| WO | 2005/060094 A1 | | 6/2005 |
| WO | 2007/052483 A1 | | 5/2007 |
| WO | WO 2007/131501 | * | 11/2007 |
| WO | WO 2008/072439 | * | 6/2008 |

OTHER PUBLICATIONS

English language machine translation of JP 10-65490 including claims, published Mar. 6, 1998, 7 pages.*
Official Communication issued in corresponding European Patent Application No. 09773100.4, mailed on Jan. 4, 2013.
Official Communication issued in International Patent Application No. PCT/JP2009/002243, mailed on Aug. 18, 2009.

* cited by examiner

BAND REJECTION FILTER

BACKGROUND OF THE INVENTION

1. Field of the Invention

The present invention relates to band rejection filters, and particularly relates to a band rejection filter having a ladder circuit configuration including a plurality of elastic wave resonators.

2. Description of the Related Art

In recent years, broadcasting service for mobile devices for digital terrestrial television broadcasting has been started in various countries including Japan, and practical use of such broadcasting service has been discussed in many countries. Under this circumstance, cellular phones having a function of receiving broadcasting service for mobile devices for digital terrestrial television broadcasting have been put into practical use. The cellular phones having the function of receiving broadcasting service for mobile devices for digital terrestrial television broadcasting include TV tuners used to receive the broadcasting service for mobile devices. In such a cellular phone, there arise problems in that, if a transmission signal of the cellular phone and a broadcasting signal of the broadcasting service for mobile devices interfere with each other, sensitivity for receiving the broadcasting service for mobile devices is deteriorated and a TV tuner for receiving the broadcasting service for mobile devices malfunctions.

Therefore, such a cellular phone includes a band rejection filter used to prevent interference between the transmission signal of the cellular phone and the broadcasting signal of the broadcasting service for mobile devices by preventing the transmission signal of the cellular phone from being transmitted to the TV tuner used to receive the broadcasting service for mobile devices. The band rejection filter has a function of allowing the broadcasting signal of the broadcasting service for mobile devices to be transmitted to the TV tuner used to receive the broadcasting service for mobile devices and removing the transmission signal of the cellular phone, and is disposed between an antenna and the TV tuner used to receive the broadcasting service for mobile devices in the cellular phone.

The band rejection filter should have a filter characteristic in which a passband which allows transmission signals of the broadcasting service for mobile devices to pass and an attenuation band which removes transmission signals of the cellular phone are included. In the broadcasting service for mobile devices for digital terrestrial television broadcasting in Japan, a band for broadcasting signals corresponds to a UHF band (470 MHz to 770 MHz). On the other hand, a band for transmission signals for cellular phones corresponds to a band in the vicinity of 800 MHz to 900 MHz. Therefore, band rejection filters included in the cellular phones having the function of receiving the broadcasting service for mobile devices in Japan include a passband corresponding to the UHF band (470 MHz to 770 MHz) which is the band for the broadcasting signals and an attenuation band corresponding to a band in the vicinity of 800 MHz to 900 MHz which is the band for the transmission signals for the cellular phones.

In such a band rejection filter, in order to appropriately remove the transmission signals of the cellular phones, high sharpness of a filter characteristic is required between an end of the passband which allows the broadcasting signals of the broadcasting service for mobile devices to pass and the attenuation band which removes the transmission signals of the cellular phones.

In general, as a filter having a passband and an attenuation band, a filter device having a ladder circuit configuration is known. For example, Japanese Patent No. 3827232 and Japanese Unexamined Patent Application Publication No. 10-65490 disclose various filters having respective ladder circuit configurations utilizing elastic waves. FIG. 29 shows a filter device 101 having a ladder circuit configuration disclosed in Japanese Patent No. 3827232. In the filter device 101, a series arm which connects an input terminal 102 to an output terminal 103 includes a plurality of series arm resonators 111 to 113 which are connected to one another in series. Furthermore, a plurality of parallel arms are disposed between the series arm and the ground potential. The plurality of parallel arms include respective parallel arm resonators 114 to 117.

In the filter device 101, a capacitor 118 is connected to the parallel arm resonator 114 in parallel among the plurality of parallel arm resonators 114 to 117. Therefore, an electromechanical coupling coefficient of the parallel arm resonator 114 is smaller than those of the parallel arm resonators 115 to 117. As a result, sharpness of the filter characteristic at ends of a passband is enhanced.

Furthermore, Japanese Patent No. 3827232 discloses the following two methods as other methods for making one electromechanical coupling coefficient different from another electromechanical coupling coefficient:

(1) a method for setting different standard film thicknesses ($h/\lambda$) of IDTs (Interdigital Transducers) included in resonators; and (2) a method for setting different duty ratios of the IDTs included in the resonators.

Moreover, Japanese Unexamined Patent Application Publication No. 10-65490 discloses a SAW (Surface Acoustic Wave) band rejection filter including a plurality of series arm resonators and a plurality of parallel arm resonators to which respective inductance elements are connected in parallel. In this SAW band rejection filter, resonant frequencies of the parallel arm resonators may be controlled by controlling characteristics of the inductance elements connected to the parallel arm resonators in parallel. Accordingly, a low insertion loss is attained.

As described above, according to the filter device 101 disclosed in Japanese Patent No. 3827232, the sharpness of the filter characteristic at the ends of the passband can be enhanced. However, there arises a problem in that, if the capacitor is connected to the parallel arm resonator in parallel as disclosed in Japanese Patent No. 3827232, an area in which the ladder circuit occupies is increased, and accordingly, cost for fabrication of the filter device is increased.

Furthermore, in a case where different electromechanical coupling coefficients are obtained by setting different standard film thicknesses ($h/\lambda$) of IDTs included in resonators, different thin-film forming processes should be performed for different resonators. Accordingly, cost for fabrication of the filter device is increased.

Moreover, an electromechanical coupling coefficient is mainly determined depending on a wafer member, and does not considerably depend on a duty ratio. Therefore, it is difficult to obtain different electromechanical coupling coefficients of resonators by setting different duty ratios of IDTs included in the resonators. Accordingly, it is difficult to efficiently improve the sharpness of a filter characteristic at ends of a passband.

As disclosed in Japanese Unexamined Patent Application Publication No. 10-65490, impedance characteristics of resonators can be controlled by controlling characteristics of inductance elements connected to parallel arm resonators in parallel. Accordingly, sharpness of a filter characteristic at ends of a passband can be enhanced. However, in a case where the characteristics of the inductance elements connected to the parallel arm resonators in parallel are controlled, since electromechanical coupling coefficients are not substantially changed, it is difficult to enhance the sharpness of the filter characteristic at the ends of the passband while an attenuation amount is maintained.

SUMMARY OF THE INVENTION

Preferred embodiments of the present invention provide an inexpensive compact band rejection filter which has high sharpness of a filter characteristic at ends of a passband and which attains a large attenuation amount.

A band rejection filter according to a preferred embodiment of the present invention includes a ladder circuit configuration including a series arm arranged to connect an input terminal and an output terminal to each other, a parallel arm which is connected between the series arm and a ground potential, a plurality of elastic wave resonators which are disposed in at least one of the series arm and the parallel arm, and an inductance element which is disposed in at least one of the series arm and the parallel arm, and has a first attenuation band, a first passband which is adjacent to the first attenuation band, a second attenuation band which is included in the first passband, and a transition band which is adjacent to the second attenuation band. At least one of the elastic wave resonators which contributes to formation of the transition band has a propagation angle larger than propagation angles of the others of the elastic wave resonators.

Note that the term "a propagation angle of an elastic wave resonator" means an angle formed by crystal orientation of a piezoelectric substrate and a propagation angle of elastic waves on a surface of the piezoelectric substrate.

The term "a resonator which contributes to formation of a transition band" means a resonator which changes a frequency characteristic of a transition band when a characteristic of the resonator such as a resonant frequency or an anti-resonant frequency is changed.

A band rejection filter according to a preferred embodiment of the present invention includes a ladder circuit configuration including a series arm arranged to connect an input terminal and an output terminal to each other, a parallel arm which is connected between the series arm and a ground potential, a plurality of elastic wave resonators which are disposed in at least one of the series arm and the parallel arm, and an inductance element which is disposed in at least one of the series arm and the parallel arm, and has a first attenuation band, a first passband which is adjacent to the first attenuation band, a second attenuation band which is included in the first passband, and a transition band which is adjacent to the second attenuation band. At least one of the elastic wave resonators which contributes to formation of the transition band has a propagation angle larger than propagation angles of the others of the elastic wave resonators, and therefore, at least one of the elastic wave resonators which contributes to the formation of the transition band has an electromechanical coupling coefficient smaller than electromechanical coupling coefficients of the others of the elastic wave resonators.

According to a first preferred embodiment of the present invention, a plurality of the inductance elements are disposed in the series arm and a plurality of the parallel arms connected between the series arm and a ground potential, and the elastic wave resonators are disposed in the respective parallel arms.

At least one of the elastic wave resonators may have a resonant frequency different from resonant frequencies of the others of the elastic wave resonators, and one of the elastic wave resonators which has the lowest resonant frequency may have the propagation angle larger than the propagation angles of the others of the elastic wave resonators.

According to a second preferred embodiment of the present invention, the plurality of elastic wave resonators are arranged in the series arm, and the inductance element is disposed in the parallel arm.

At least one of the elastic wave resonators may have an anti-resonant frequency different from anti-resonant frequencies of the others of the elastic wave resonators, and one of the elastic wave resonators which has the highest anti-resonant frequency may have the propagation angle larger than the propagation angles of the others of the elastic wave resonators.

According to a third preferred embodiment of the present invention, at least one of the elastic wave resonators is arranged in the series arm, at least one of the elastic wave resonators is disposed in the parallel arm, and the inductance element is disposed in at least one of the series arm and the parallel arm.

One of the elastic wave resonators which has the lowest frequency among an anti-resonant frequency of at least one of the elastic wave resonators which is arranged in the series arm and a resonant frequency of at least one of the elastic wave resonators which is arranged in the parallel arm may have the propagation angle larger than the propagation angles of the others of the elastic wave resonators.

At least one of the elastic wave resonators which is disposed in the series arm may have the propagation angle larger than the propagation angle of at least one of the elastic wave resonator which is disposed in the parallel arm.

One of the elastic wave resonators having the highest frequency among an anti-resonant frequency of at least one of the elastic wave resonators which is arranged in the series arm and a resonant frequency of at least one of the elastic wave resonators which is disposed in the parallel arm may have the propagation angle larger than the propagation angles of the others of the elastic wave resonators.

At least one of the elastic wave resonators which is disposed in the parallel arm may have the propagation angle larger than the propagation angles of at least one of the elastic wave resonators which is disposed in the series arm.

The elastic wave resonators according to various preferred embodiments of the present invention may be elastic boundary wave resonators.

According to a preferred embodiment of the present invention, at least one of a plurality of elastic wave resonators which contributes to formation of a transition band has a propagation angle larger than propagation angles of the others of the elastic wave resonators, and accordingly, an inexpensive compact band rejection filter in which high sharpness of a filter characteristic at ends of passbands is realized and a large attenuation amount is attained can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will become apparent from preferred embodiments of the present invention described in detail hereinafter with reference to the accompanying drawings.

First Preferred Embodiment

Figure 1:
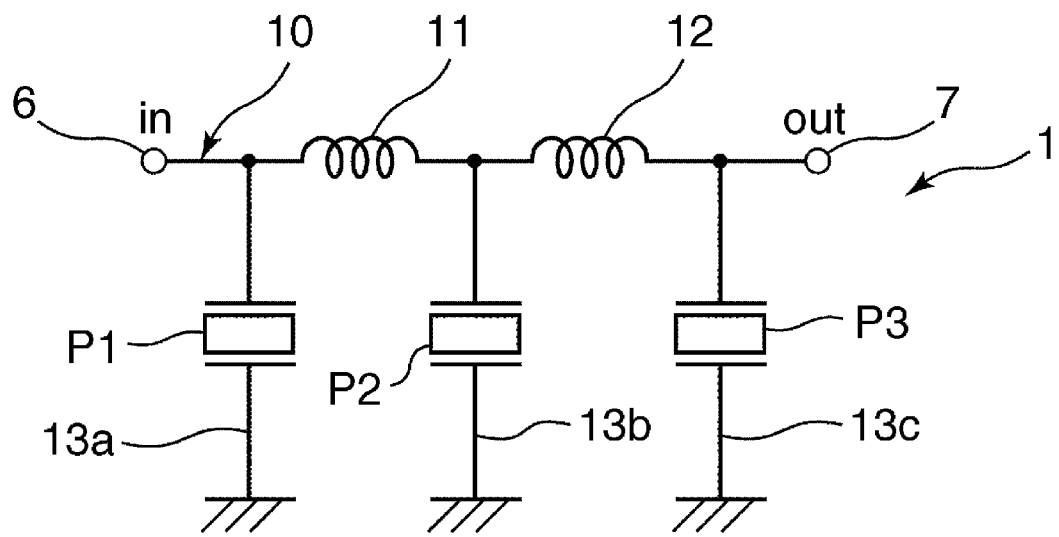
FIG. 1 is a circuit diagram illustrating a band rejection filter according to a first preferred embodiment of the present invention.
Figure 2:
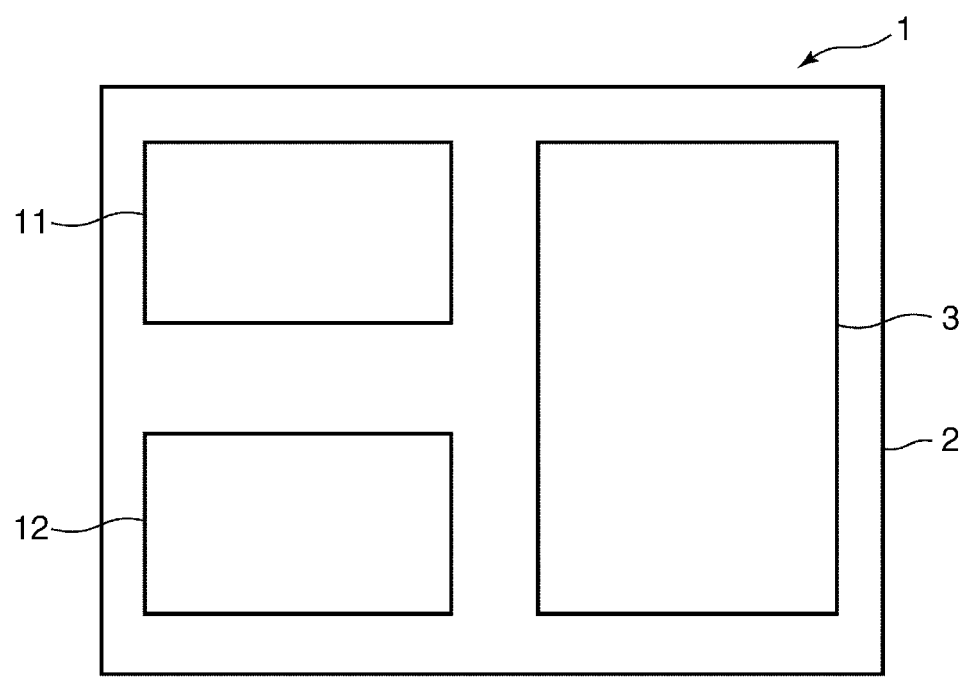
FIG. 2 is a plan view schematically illustrating the band rejection filter according to the first preferred embodiment of the present invention, in which a lamination resin layer is omitted.
Figure 3:
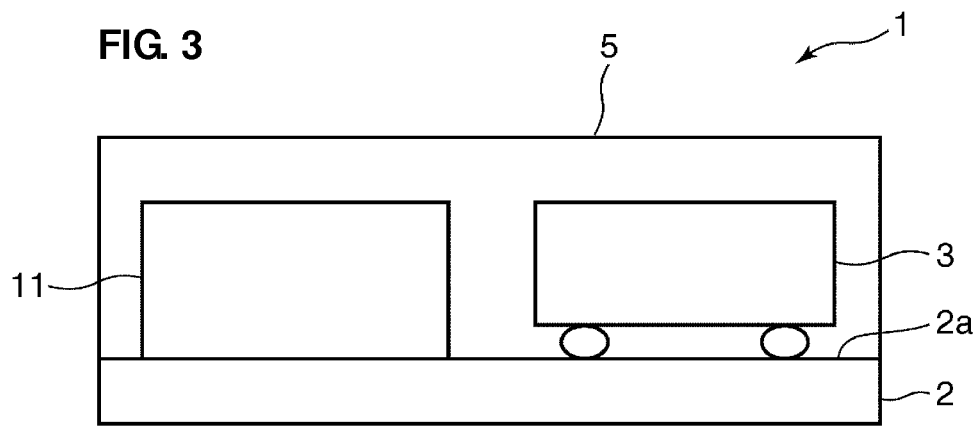
FIG. 3 is a sectional view schematically illustrating the band rejection filter according to the first preferred embodiment of the present invention.

FIG. 1 is a circuit diagram illustrating a band rejection filter 1 according to a first preferred embodiment. FIG. 2 is a plan view schematically illustrating the band rejection filter 1. FIG. 3 is a sectional view schematically illustrating the band rejection filter 1. Note that, in FIG. 2, a lamination resin layer 5, which will be described hereinafter, is omitted.

As shown in FIG. 1, the band rejection filter 1 includes a ladder circuit including a series arm 10 which connects an input terminal 6 and an output terminal 7 to each other and first to third parallel arms 13a to 13c which are connected between the series arm 10 and the ground potential.

In the series arm 10, first and second inductance elements 11 and 12 are arranged. The first parallel arm 13a is connected between the ground potential and a point of connection between the input terminal 6 and the first inductance element 11. In the first parallel arm 13a, a first parallel arm resonator P1 is disposed. The second parallel arm 13b is connected between the ground potential and a point of connection between the first inductance element 11 and the second inductance element 12. In the second parallel arm 13b, a second parallel arm resonator P2 is disposed. The third parallel arm 13c is connected between the ground potential and a point of connection between the second inductance element 12 and the output terminal 7. In the third parallel arm 13c, a third parallel arm resonator P3 is disposed.

As described above, in this preferred embodiment, the ladder circuit is configured by the first and second inductance elements 11 and 12 which are arranged in the series arm 10 and the first to third parallel arm resonators P1 to P3 which are disposed in the first to third parallel arms 13a to 13c, respectively.

Figure 30:
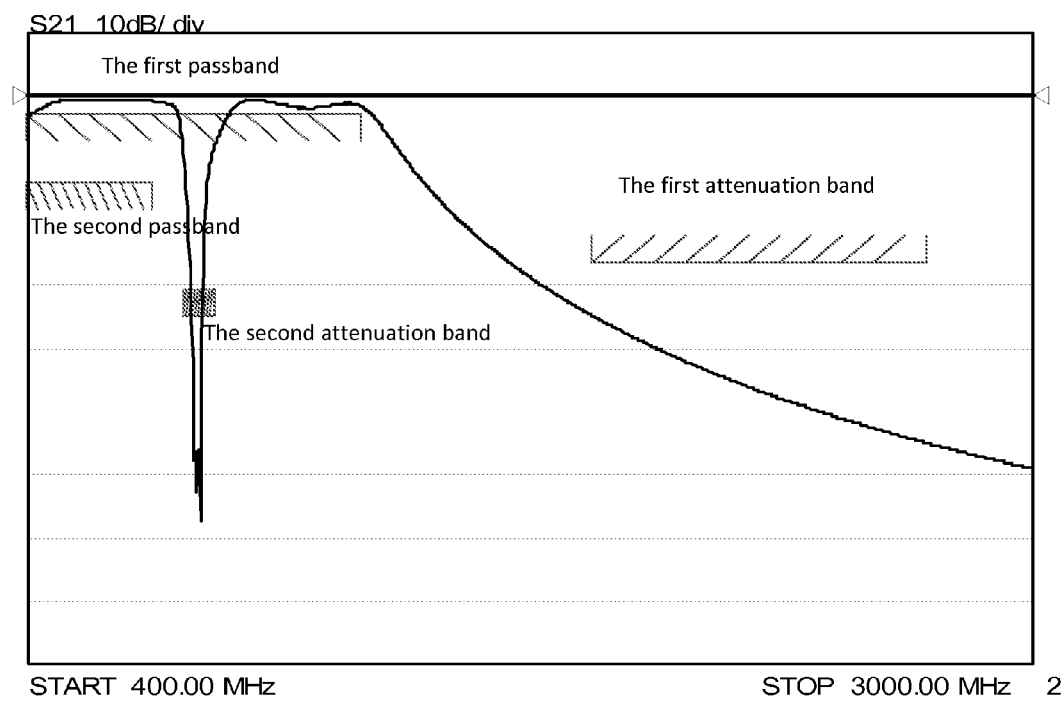
FIG. 30 is a graph illustrating the first and second passbands and the first and second attenuation bands of a band rejection filter according to a preferred embodiment of the present invention.

As shown in FIG. 30, the band rejection filter 1 has a first attenuation band in which an insertion loss is large. The first attenuation band mainly includes inductances (inductive components) of the first and second inductance elements 11 and 12 and capacitances (capacitance components) of the first to third parallel arm resonators P1 to P3.

As shown in FIG. 30, the band rejection filter 1 has a first passband which is located on a lower side relative to the first attenuation band and which attains a small insertion loss. The first passband mainly includes the inductances of the first and second inductance elements 11 and 12.

As shown in FIG. 30, the band rejection filter 1 includes a second attenuation band which is included in the first passband and in which an insertion loss is large. The second attenuation band mainly includes attenuation poles generated due to resonances of the first to third parallel arm resonators P1 to P3.

As shown in FIG. 30, the band rejection filter 1 has a second passband which is included in the first passband, which is located on a lower side relative to the second attenuation band, and in which an insertion loss is small. The second passband mainly includes the inductances of the first and second inductance elements 11 and 12.

As shown in FIG. 30, the band rejection filter 1 further includes a band which is located between the second attenuation band and the second passband and in which an insertion loss is considerably changed. In this specification, the band formed between the second attenuation band and the second passband is referred to as a "transition band". Furthermore, "sharpness of a filter characteristic in a transition band" means a degree of a change of an insertion loss relative to a frequency in the transition band. In a case where "sharpness of a filter characteristic in a transition band is high", a degree of a change of an insertion loss relative to a frequency is large in the transition band.

In this preferred embodiment, the first to third parallel arm resonators P1 to P3 preferably are integrally formed as a single elastic wave element 3 as shown in FIG. 2. As shown in FIG. 3, the elastic wave element 3 is implemented on a main surface 2a of a substrate 2. Specifically, the elastic wave element 3 is implemented on the main surface 2a of the substrate as a flip chip implementation. Furthermore, the first and second inductance elements 11 and 12 are provided on the main surface 2a of the substrate 2. The first to third parallel arm resonators P1 to P3 included in the elastic wave element 3 and the first and second inductance elements 11 and 12 provided on the main surface 2a of the substrate 2 are electrically connected to one another by lines, not shown, located on the substrate 2.

On the main surface 2a of the substrate 2, a lamination resin layer 5 is arranged so as to cover the elastic wave element 3 and the first and second inductance elements 11 and 12. The elastic wave element 3 and the first and second inductance elements 11 and 12 are sealed by the lamination resin layer 5.

Note that the substrate 2 may be made of any material. For example, the substrate 2 may be formed as a low-temperature co-fired ceramics (LTCC) substrate or a print circuit board (PCB).

The elastic wave element 3 may be a surface acoustic wave element utilizing surface acoustic waves (SAWs) or an elastic boundary wave element utilizing elastic boundary waves (BEWs). That is, the "elastic wave" includes an elastic boundary wave and a surface acoustic wave.

In this preferred embodiment, a case where an elastic boundary wave element utilizing elastic boundary waves is used as the elastic wave element 3 will be described as an example.

Figure 4:
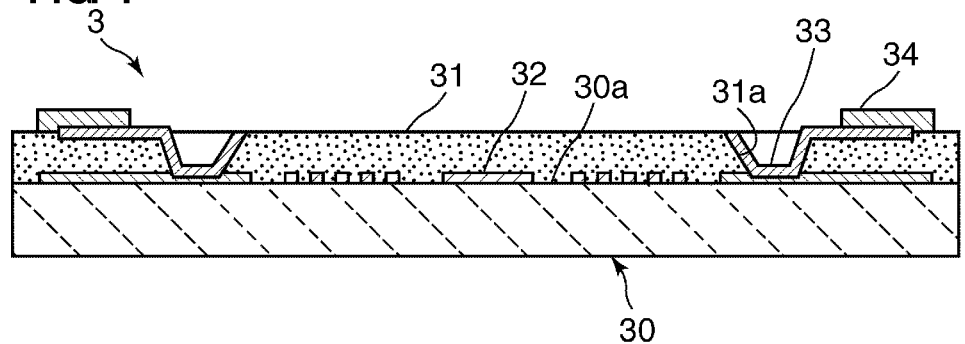
FIG. 4 is a sectional view schematically illustrating an elastic wave element according to the first preferred embodiment of the present invention.

FIG. 4 is a sectional view schematically illustrating the elastic wave element 3. As shown in FIG. 4, the elastic wave element 3 includes a piezoelectric substrate 30. On a main surface 30a of the piezoelectric substrate 30, a dielectric layer 31 is provided. On a boundary surface between the piezoelectric substrate 30 and the dielectric layer 31, an electrode structure 32 including the first to third parallel arm resonators P1 to P3 is provided.

In the dielectric layer 31, openings 31a which are opened to the electrode structure 32 are provided. On the dielectric layer 31, connection conductors 33 electrically connected to the electrode structure 32 are arranged so as to cover the openings 31a. External electrodes 34 disposed on the dielectric layer 31 are electrically connected to the electrode structure 32 through the connection conductors 33. The first to third parallel arm resonators P1 to P3 included in the electrode structure 32 are electrically connected to the first and second inductance elements 11 and 12 through the external electrodes 34.

Note that materials of the piezoelectric substrate 30, the dielectric layer 31, and the electrode structure 32 are not restricted as long as a combination of them generates an elastic boundary wave in the elastic wave element 3. Specifically, the piezoelectric substrate 30 may be formed of $LiNbO_3$, for example. The dielectric layer 31 may be formed of $SiO_2$, for example. The electrode structure 32 may be formed of Au, for example.

Figure 5:
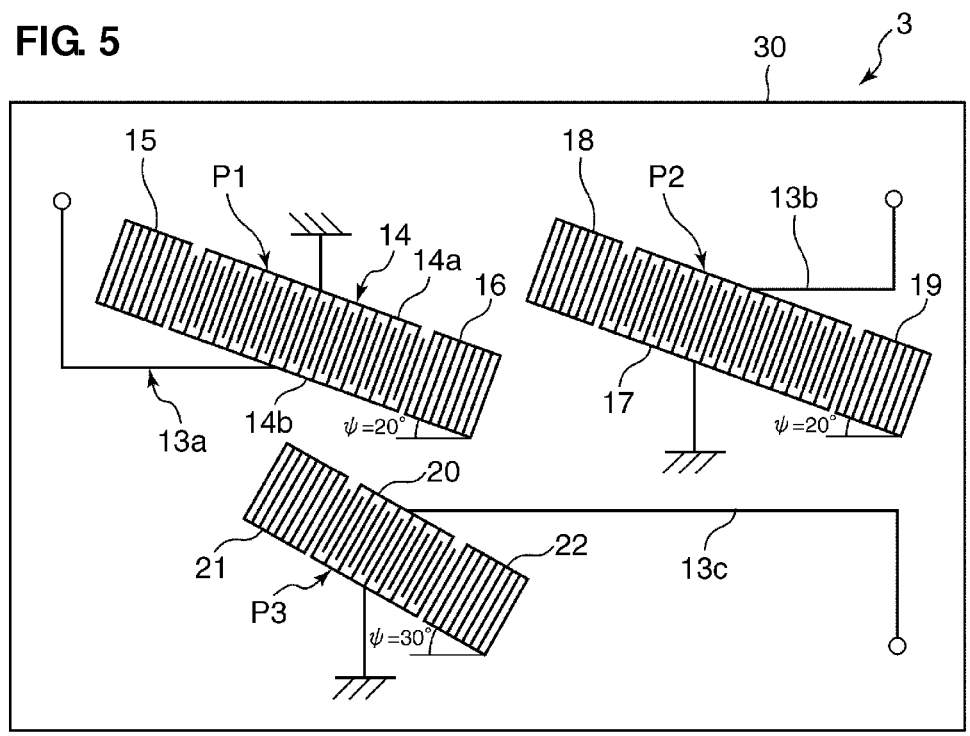
FIG. 5 is a plan view schematically illustrating the elastic wave element according to the first preferred embodiment of the present invention.

Next, configurations of the first to third parallel arm resonators P1 to P3 will be described with reference to FIG. 5. As shown in FIG. 5, each of the first to third parallel arm resonators P1 to P3 includes an IDT (Interdigital Transducer) and a pair of grating reflectors which are arranged so as to sandwich the IDT in an elastic-wave propagation angle.

Specifically, the first parallel arm resonator P1 includes an IDT 14. The IDT 14 includes a pair of interdigital electrodes 14a and 14b. Each of the interdigital electrodes 14a and 14b includes a bus bar and a plurality of electrode fingers which are connected to the bus bar and which extend in parallel. The interdigital electrodes 14a and 14b are disposed opposite each other so that the plurality of electrode fingers of the interdigital electrodes 14a and 14b are alternately arranged. The IDT 14 is sandwiched between grating reflectors 15 and 16 in the elastic-wave propagation angle.

Similarly, the second parallel arm resonator P2 includes an IDT 17 and a pair of grating reflectors 18 and 19 disposed so as to sandwich the IDT 17 in an elastic-wave propagation angle. The third parallel arm resonator P3 includes an IDT 20 and a pair of grating reflectors 21 and 22 disposed so as to sandwich the IDT 20 in an elastic-wave propagation angle.

In this preferred embodiment, a propagation angle ($\psi$) of at least one of the first to third parallel arm resonators P1 to P3 is larger than propagation angles ($\psi$) of the others of the first to third parallel arm resonators P1 to P3. Specifically, a propagation angle ($\psi$) of at least one of the first to third parallel arm resonators P1 to P3 which contributes to formation of the transition band is larger than propagation angles ($\psi$) of the others of the first to third parallel arm resonators P1 to P3. Accordingly, an electromechanical coupling coefficient ($k^2$) of at least one of the parallel arm resonators which contributes to the formation of the transition band is smaller than electromechanical coupling coefficients ($k^2$) of the others of the parallel arm resonators.

Note that a fact that an electromechanical coupling coefficient ($k^2$) is made smaller by making a propagation angle ($\psi$) of an elastic wave resonator larger is disclosed in WO 2004/070946A1.

As described in this preferred embodiment, since the propagation angle ($\psi$) of at least one of the first to third parallel arm resonators P1 to P3 which contributes to the formation of the transition band is larger than propagation angles ($\psi$) of the others of the parallel arm resonators, the electromechanical coupling coefficient ($k^2$) of at least one of the first to third parallel arm resonators P1 to P3 which contributes to the formation of the transition band is smaller than the electromechanical coupling coefficients ($k^2$) of the others of the parallel arm resonators, and accordingly, as will be described hereinafter, sharpness of the filter characteristic at ends of the passbands can be enhanced while an attenuation amount is ensured. Furthermore, a small insertion loss can be obtained in the passbands.

For example, as disclosed in Japanese Patent No. 3827232, an electromechanical coupling coefficient ($k^2$) of a parallel arm resonator may be made smaller by connecting a capacitor to the parallel arm resonator in parallel. However, when the capacitor is connected to the parallel arm resonator in parallel, an area occupied by a ladder circuit is increased by an area occupied by the capacitor. On the other hand, in this preferred embodiment, an electromechanical coupling coefficient ($k^2$) of a parallel arm resonator is made smaller by setting a propagation angle ($\psi$) of the parallel arm resonator so as to be different from other propagation angles ($\psi$). Accordingly, in this preferred embodiment, since the addition of another element for controlling the electromechanical coupling coefficient ($k^2$) is not required in the ladder circuit, a small area occupied by the ladder circuit is attained. Consequently, a compact band rejection filter 1 can be obtained, and as a result, an inexpensive band rejection filter 1 can be attained.

Furthermore, as another method for obtaining a small electromechanical coupling coefficient ($k^2$) of a parallel arm resonator, a method for obtaining different standard film thicknesses (h/λ) of IDTs included in a resonator is taken as an example. However, in order to obtain the different standard film thicknesses (h/λ) of the IDTs included in the resonator, a parallel arm resonator in which a small electromechanical coupling coefficient ($k^2$) is to be obtained should be formed in a thin-film forming process which is different from a thin-film forming process for other parallel arm resonators. However, in this preferred embodiment, the standard film thicknesses (h/λ) of the IDTs in the first to third parallel arm resonators P1 to P3 can be the same as one another, and all the first to third parallel arm resonators P1 to P3 can be formed in the same thin-film forming process. Accordingly, an inexpensive band rejection filter 1 can be fabricated by a simple fabrication process.

Furthermore, as disclosed in Japanese Unexamined Patent Application Publication No. 10-65490, an impedance characteristic of a parallel arm resonator may be changed by connecting an inductance element to the parallel arm resonator in parallel. However, in this case, it is difficult to enhance sharpness of a filter characteristic in a transition band while an attenuation amount is maintained. On the other hand, in this preferred embodiment, since an impedance characteristic of a parallel arm resonator is changed by changing an electromechanical coupling coefficient ($k^2$), the sharpness of the filter characteristic in the transition band can be enhanced while an attenuation amount is maintained. That is, a large attenuation amount and high sharpness of the filter characteristic in the transition band can be simultaneously realized.

Note that, as described in this preferred embodiment, in the band rejection filter 1 configured such that the first and second inductance elements 11 and 12 are arranged in the series arm 10 and the first to third parallel arm resonators P1 to P3 are disposed in the first to third parallel arms 13a to 13c, respectively, a parallel arm resonator which has the lowest resonant frequency contributes to the formation of the transition band.

In this preferred embodiment, among the first to third parallel arm resonators P1 to P3, the third parallel arm resonator P3 has the lowest resonant frequency. Therefore, the third parallel arm resonator P3 contributes to the formation of the transition band. The parallel arm resonators other than the third parallel arm resonator P3, that is, the first and parallel arm resonators P1 and P2 mainly contribute to the formation of the second attenuation band and do not affect a frequency characteristic of the transition band. Accordingly, as shown in FIG. 5, a propagation angle ($\psi=30°$) of the third parallel arm resonator P3 is larger than propagation angles ($\psi=20°$) of the first and second parallel arm resonators P1 and P2. By this, the electromechanical coupling coefficient ($k^2$) of the third parallel arm resonator P3 is smaller than the electromechanical coupling coefficients ($k^2$) of the first and second parallel arm resonators P1 and P2. Consequently, sharpness of an impedance characteristic of the third parallel arm resonator P3 is enhanced, and the sharpness of the filter characteristic in the transition band is enhanced.

Note that, when a propagation angle ($\psi$) is 45° or less, the larger the propagation angle ($\psi$) becomes, the smaller a temperature coefficient of frequency (TCF) of an impedance characteristic of an elastic wave resonator becomes. In this preferred embodiment, since the propagation angle ($\psi$) of the third parallel arm resonator P3 is roughly set so as to be equal to or smaller than 45°, the TCF of the impedance characteristic of the third parallel arm resonator P3 which affects the filter characteristic of the transition band is small. Accordingly, a TCF of the filter characteristic in the transition band is also small. Consequently, in the band rejection filter 1, fabrication tolerance regarding frequencies is large, and a high fabrication yield rate is realized.

Note that, in this preferred embodiment, a case where the two inductance elements are arranged in the series arm 10 and the three parallel arm resonators are disposed in the first to third parallel arms 13a to 13c, respectively, is described as an example. However, in this preferred embodiment, the number of inductance elements arranged in the series arm and the number of parallel arm resonators disposed in the parallel arms are not restricted.

FIRST EXAMPLE AND FIRST COMPARATIVE EXAMPLE

A band rejection filter 1 according to a first example corresponding to the first preferred embodiment is fabricated as described below.

On a piezoelectric substrate 30 formed of $LiNbO_3$, an electrode structure 32 which is formed of Au and which has a thickness of 0.05λ (λ: a wavelength of an elastic boundary wave in a second attenuation band of the band rejection filter 1) is formed. Note that an Euler angle of the piezoelectric substrate 30 satisfies the following equations: $\phi=0°$ and $\phi=105°$.

Thereafter, on the piezoelectric substrate 30, a dielectric layer 31 which is formed of $SiO_2$ and which has a thickness of 10 μm is formed so as to cover the electrode structure 32 whereby an elastic wave element 3 is obtained. Using the elastic wave element 3, the band rejection filter 1 having a circuit configuration the same as that shown in FIG. 1 is fabricated as the first example.

Note that detailed configurations of first to third parallel arm resonators P1 to P3 are as shown in Table 1 below.

TABLE 1

|  | P1 | P2 | P3 |
| --- | --- | --- | --- |
| Number of pairs of electrode fingers in the IDTs (pair) | 40 | 40 | 40 |

TABLE 1-continued

|  | P1 | P2 | P3 |
|---|---|---|---|
| Number of pairs of electrode fingers in the reflectors (pair) | 10 | 10 | 10 |
| wavelength $\lambda$ (μm) | 3.764 | 3.804 | 3.917 |
| cross width (μm) | 110 | 110 | 90 |
| IDT duty ratio | 0.60 | 0.60 | 0.60 |
| reflector duty ratio | 0.60 | 0.60 | 0.60 |
| propagation angle $\psi$ (°) | 10 | 10 | 30 |

A band rejection filter according to a first comparative example is fabricated similarly to the first example except that all propagation angles ($\psi$) of first to third parallel arm resonators P1 to P3 of the first comparative example are set to 10°.

Impedance characteristics of the first to third parallel arm resonators P1 to P3 of the band rejection filter 1 according to the first example are individually measured, and an insertion loss of the band rejection filter 1 according to the first example is compared with an insertion loss of the band rejection filter according to the first comparative example.

Figure 6:
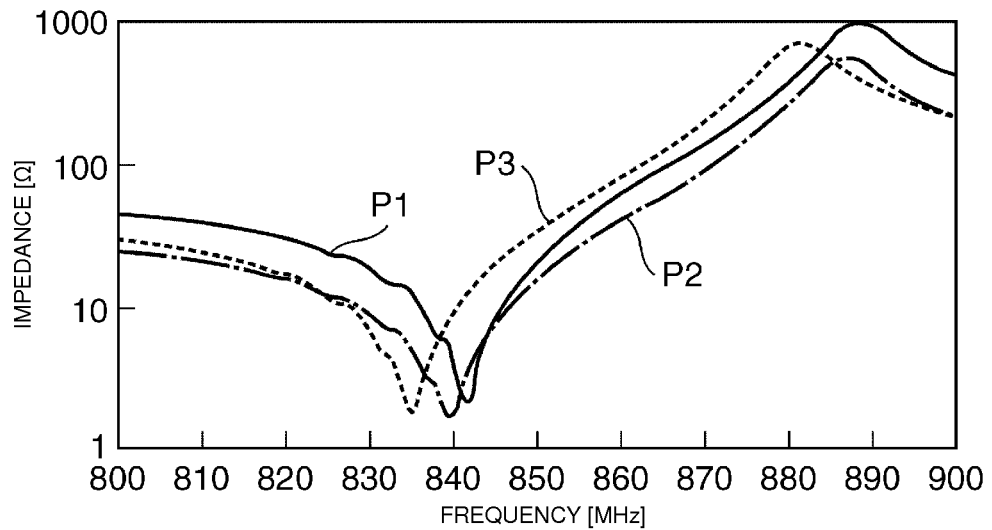
FIG. 6 is a graph illustrating impedance characteristics of parallel arm resonators according to the first preferred embodiment of the present invention.

FIG. 6 shows impedance characteristics of the first to third parallel arm resonators P1 to P3 in the band rejection filter 1 according to the first example. In FIG. 6, a solid line denoted by a reference symbol P1 represents the impedance characteristic of the first parallel arm resonator P1. A dashed line denoted by a reference symbol P2 represents the impedance characteristic of the second parallel arm resonator P2. A dotted line denoted by a reference symbol P3 represents the impedance characteristic of the third parallel arm resonator P3.

As shown in FIG. 6, among resonant frequencies of the first to third parallel arm resonators P1 to P3, the resonant frequency of the third parallel arm resonator P3 is the lowest resonant frequency. As a result, the filter characteristic in the transition band is determined by the third parallel arm resonator P3.

Figure 7:
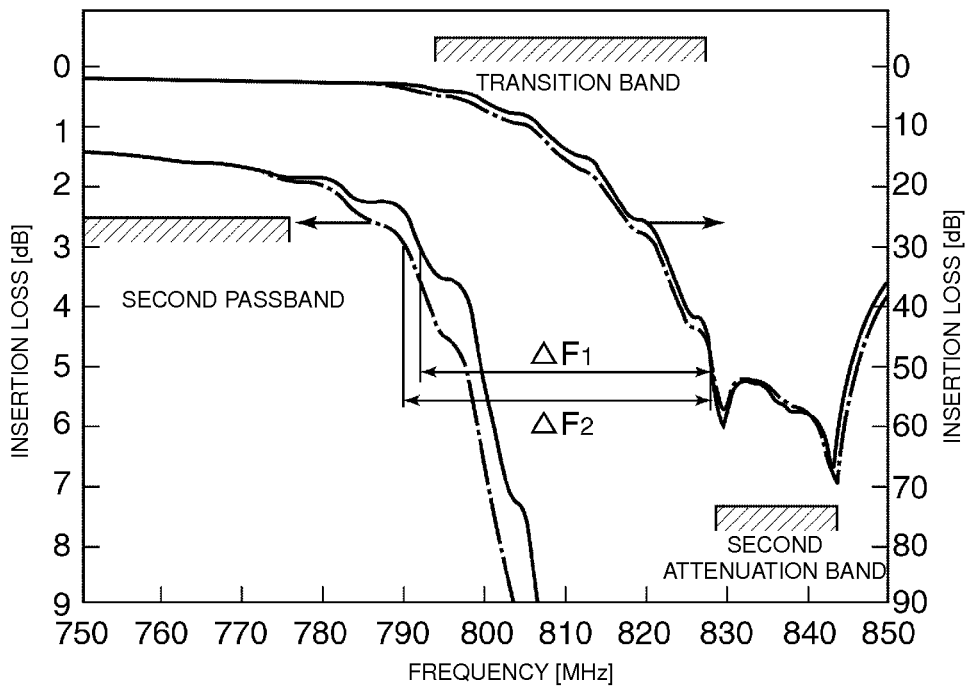
FIG. 7 is a graph illustrating insertion losses of a band rejection filter according to a first example and a band rejection filter according to a first comparative example.

FIG. 7 shows insertion losses of the band rejection filter 1 according to the first example and the band rejection filter according to the first comparative example. Solid lines in a graph shown in FIG. 7 represents insertion losses of the band rejection filter 1 according to the first example, and dashed lines in the graph shown in FIG. 7 represents insertion losses of the band rejection filter according to the first comparative example.

The band rejection filter 1 of the first example is preferably mounted on cellular phones having a function of receiving broadcasting service for mobile devices for digital terrestrial television broadcasting in Japan, for example. Therefore, the band rejection filter 1 of the first example is disposed between an antenna (not shown) and a TV tuner (not shown) for receiving the broadcasting service for mobile devices in such a cellular phone.

Since a band for broadcasting signals of the broadcasting service for mobile devices in Japan corresponds to a UHF band (470 MHz to 770 MHz), a second passband of the band rejection filter 1 of the first example corresponds to a range from approximately 470 MHz to approximately 780 MHz. Furthermore, since a band for transmission signals of cellular phones is included in a range from approximately 800 MHz to approximately 900 MHz, a second attenuation band of the band rejection filter according to the first example corresponds to a range from approximately 830 MHz to approximately 845 MHz.

Accordingly, the band rejection filter 1 of the first example has a function of allowing the broadcasting signals of the broadcasting service for mobile devices to pass toward the TV tuner for receiving the broadcasting service for mobile devices and removing the transmission signals of the cellular phones.

Consequently, as shown in FIG. 7, the band rejection filter 1 of the first example has higher sharpness of the filter characteristic in the transition band which is located on a lower side relative to the second attenuation band than the band rejection filter of the first comparative example. Specifically, as a difference ($\Delta F$) between a frequency corresponding to an insertion loss of 3 dB on a higher side relative to the second passband and a frequency corresponding to an insertion loss of 50 dB on a lower side relative to the second attenuation band, 38.1 MHz is obtained in the first comparative example ($\Delta F2$) whereas 36.3 MHz is obtained in the first example ($\Delta F1$). That is, the frequency difference ($\Delta F1$) of the first example is smaller than the frequency difference ($\Delta F2$) of the first comparative example by 1.8 MHz. Consequently, it is recognized that the sharpness of the filter characteristic in the transition band which is located on the lower side relative to the second attenuation band can be enhanced by making the propagation angle ($\psi$) of the third parallel arm resonator P3 which has the lowest resonant frequency larger than the propagation angles ($\psi$) of the first and second parallel arm resonators P1 and P2.

Note that it is possible that the band for transmission signals of cellular phones is included in the vicinity of approximately 1.5 GHz, approximately 1.7 GHz, and approximately 2.0 GHz. Since such a band for transmission signals of cellular phones is included in the first attenuation band of the band rejection filter 1 of the first example, the band rejection filter 1 removes the transmission signals of cellular phones. Therefore, the transmission signals of cellular phones are prevented from being transmitted to the TV tuner for receiving the broadcasting service for mobile devices which is disposed in a later stage of the band rejection filter 1. As described above, the band rejection filter 1 of the first example can remove not only the transmission signals of cellular phones in the vicinity of a range from approximately 800 MHz to approximately 900 MHz but also transmission signals of cellular phones in the vicinity of approximately 1.5 GHz, approximately 1.7 GHz, and approximately 2.0 GHz. Consequently, the band rejection filter 1 of the first example can reliably prevent interference between the transmission signals of cellular phones and the broadcasting signals of the broadcasting service for mobile devices.

In the band rejection filter 1 of the first preferred embodiment, among the first to third parallel arm resonators P1 to P3, the third parallel arm resonator P3 which has the lowest resonant frequency and which contributes to formation of the transition band has the propagation angle ($\psi=30°$) larger than the propagation angles ($\psi=20°$) of the first and second parallel arm resonators P1 and P2, and the propagation angles ($\psi$) of the first and second parallel arm resonators P1 and P2 are the same as each other. However, the present invention is not limited to this configuration. That is, the propagation angles ($\psi$) of the first and second parallel arm resonators P1 and P2 may be different from each other, or one of the propagation angles ($\psi$) of the first and second parallel arm resonators P1 and P2 may be the same as the propagation angle ($\psi$) of the third parallel arm resonator P3.

Even in a case where propagation angles ($\psi$) of a plurality of parallel arm resonators are different from one another, or a case where a propagation angle ($\psi$) of at least one of parallel arm resonators is different from propagation angles ($\psi$) of the others of the parallel arm resonators, an electromechanical coupling coefficient ($k^2$) of at least one of the parallel arm resonators which contributes to formation of a transition band is smaller than electromechanical coupling coefficients ($k^2$) of the others of the parallel arm resonators by setting the propagation angle ($\psi$) of the parallel arm resonator which contributes to the formation of the transition band to be larger than the propagation angles ($\psi$) of the others of the parallel arm resonators. Accordingly, as with the first preferred embodiment, sharpness of an impedance characteristic of the parallel arm resonator which has the lowest resonant frequency and which contributes to the formation of the transition band is enhanced, and sharpness of a filter characteristic in the transition band is enhanced.

Furthermore, even in a case where propagation angles ($\psi$) of a plurality of parallel arm resonators are different from one another, or a case where a propagation angle ($\psi$) of at least one of parallel arm resonators is different from propagation angles ($\psi$) of the others of the parallel arm resonators, an electromechanical coupling coefficient ($k^2$) of at least one of the parallel arm resonators which contributes to formation of a transition band is smaller than an electromechanical coupling coefficient ($k^2$) of at least one of the parallel arm resonators by setting the propagation angle ($\psi$) of the parallel arm resonator which contributes to the formation of the transition band to be larger than the propagation angle ($\psi$) of at least one of the parallel arm resonators. Accordingly, as with the first preferred embodiment, sharpness of an impedance characteristic of the parallel arm resonator which has the lowest resonant frequency and which contributes to the formation of the transition band is enhanced, and sharpness of a filter characteristic in the transition band is enhanced.

Hereinafter, another preferred embodiment of the present invention will be described. In the description below, components having functions substantially the same as those of the first preferred embodiment are denoted by reference numerals the same as those of the first preferred embodiment, and descriptions thereof are omitted. Furthermore, FIGS. 2 to 4 are referred to in common with the first preferred embodiment.

Second Preferred Embodiment

Figure 8:
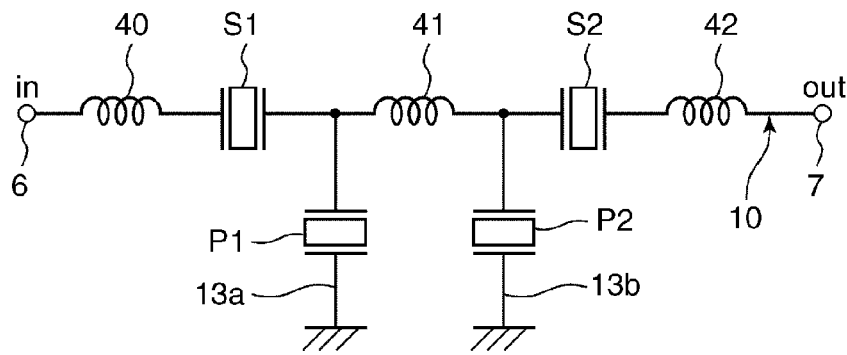
FIG. 8 is a circuit diagram illustrating a band rejection filter according to a second preferred embodiment of the present invention.

FIG. 8 is a circuit diagram illustrating a band rejection filter according to a second preferred embodiment. As shown in FIG. 8, the band rejection filter of the second preferred embodiment includes a ladder circuit including a series arm 10 which connects an input terminal 6 and an output terminal 7 to each other, and first and second parallel arms 13a and 13b which are connected between the series arm 10 and the ground potential. In the band rejection filter of the second preferred embodiment, first to third inductance elements 40 to and first and second series arm resonators S1 and S2 are arranged in the series arm 10. Specifically, the first and second series arm resonators S1 and S2 are connected to each other in series in the series arm 10. In the series arm 10, the first inductance element 40 is connected between the input terminal 6 and the first series arm resonator S1. The second inductance element 41 is connected between the first and second series arm resonators S1 and S2. The third inductance element 42 is connected between the second series arm resonator S2 and the output terminal 7.

The first and second parallel arms 13a and 13b are connected between the series arm 10 and the ground potential. Specifically, the first parallel arm 13a is connected between the ground potential and a point of connection between the first series arm resonator S1 and the second inductance element 41. The second parallel arm 13b is connected between the ground potential and a point of connection between the second inductance element 41 and the second series arm resonator S2. In the first parallel arm 13a, a first parallel arm resonator P1 is disposed. In a second parallel arm 13b, a second parallel arm resonator P2 is disposed.

As described above, in this preferred embodiment, the ladder circuit is configured by the first to third inductance elements 40 to 42 and the first and second series arm resonators S1 and S2 which are arranged in the series arm 10 and the first and second parallel arm resonators P1 and P2 which are disposed in the first and second parallel arms 13a and 13b, respectively. Note that, in the present preferred embodiment, as with the first preferred embodiment, the first and second series arm resonators S1 and S2 and the first and second parallel arm resonators P1 and P2 are preferably integrally formed as a single elastic wave element.

The band rejection filter of the second preferred embodiment includes first attenuation bands in which an insertion loss is large. The first attenuation bands are respectively formed on a lower side and a higher side. The lower first attenuation band is mainly formed by capacitances of the first and second series arm resonators S1 and S2. The higher first attenuation band is mainly formed by inductances of the first to third inductance elements 40 to 42 and capacitances of the first and second parallel arm resonators P1 and P2.

The band rejection filter of the second preferred embodiment has a first passband which is located between the lower first attenuation band and the higher first attenuation band and in which an insertion loss is small. The first passband is mainly formed by the inductances of the first to third inductance elements 40 to 42.

The band rejection filter of the second preferred embodiment has a second attenuation band which is included in the first passband and in which an insertion loss is large. The second attenuation band is mainly formed by attenuation poles generated due to anti-resonances of the first and second series arm resonators S1 and S2 and attenuation poles generated due to resonances of the first and second parallel arm resonators P1 and P2.

The band rejection filter of the second preferred embodiment has a second passband which is included in the first passband, which is located on a lower side relative to the second attenuation band, and in which an insertion loss is small. The second passband is mainly formed by the inductances of the first to third inductance elements 40 to 42.

Then, the band rejection filter of the second preferred embodiment has a transition band between the second attenuation band and the second passband.

In this preferred embodiment, among the first and second series arm resonators S1 and S2 and the first and second parallel arm resonators P1 and P2, a propagation angle ($\psi$) of at least one of the elastic wave resonators is larger than propagation angles ($\psi$) of the others of the elastic wave resonators. Specifically, among the first and second series arm resonators S1 and S2 and the first and second parallel arm resonators P1 and P2, the propagation angle ($\psi$) of at least one of the elastic wave resonators which contributes to formation of the transition band is larger than the propagation angles ($\psi$) of the others of the elastic wave resonators. Accordingly, an electromechanical coupling coefficient ($k^2$) of at least one of the elastic wave resonators which contributes to the formation of the transition band is smaller than electromechanical coupling coefficients ($k^2$) of the others of the elastic wave resonators.

As described in this preferred embodiment, among the first and second series arm resonators S1 and S2 and the first and second parallel arm resonators P1 and P2, since the propagation angle (ψ) of at least one of the elastic wave resonators which contributes to the formation of the transition band is larger than the propagation angles (ψ) of the others of the elastic wave resonators, the electromechanical coupling coefficient ($k^2$) of at least one of the elastic wave resonators which contributes to the formation of the transition band is smaller than the electromechanical coupling coefficients ($k^2$) of the others of the elastic wave resonators, and accordingly, sharpness of a filter characteristic at ends of the passbands can be enhanced while an attenuation amount is ensured. Furthermore, small insertion losses in the passbands are attained.

In this preferred embodiment, a propagation angle (ψ) of one of the elastic wave resonators which has the lowest frequency among the anti-resonant frequencies of the first and second series arm resonators S1 and S2 and the resonant frequencies of the first and second parallel arm resonators P1 and P2 is larger than propagation angles (ψ) of the others of the elastic wave resonators. Accordingly, an electromechanical coupling coefficient ($k^2$) of the elastic wave resonator having the lowest frequency is smaller than electromechanical coupling coefficients of the other elastic wave resonators. Therefore, the sharpness of the filter characteristic in the transition band which is located on the lower side relative to the second attenuation band is enhanced.

Specifically, in the band rejection filter of this preferred embodiment configured such that the first to third inductance elements 40 to 42 and the first and second series arm resonators S1 and S2 are arranged in the series arm 10 and the first and second parallel arm resonators P1 and P2 are disposed in the first and second parallel arms 13a and 13b, respectively, an elastic wave resonator having the lowest frequency among the anti-resonant frequencies of the first and second series arm resonators S1 and S2 and the resonant frequencies of the first and second parallel arm resonators P1 and P2 contributes to the formation of the transition band. In this preferred embodiment, among the anti-resonant frequencies of the first and second series arm resonators S1 and S2 and the resonant frequencies of the first and second parallel arm resonators P1 and P2, the anti-resonant frequency of the first series arm resonator S1 is the lowest frequency. Accordingly, the first series arm resonator S1 contributes to the formation of the transition band which is located on the lower side relative to the second attenuation band.

Figure 9:
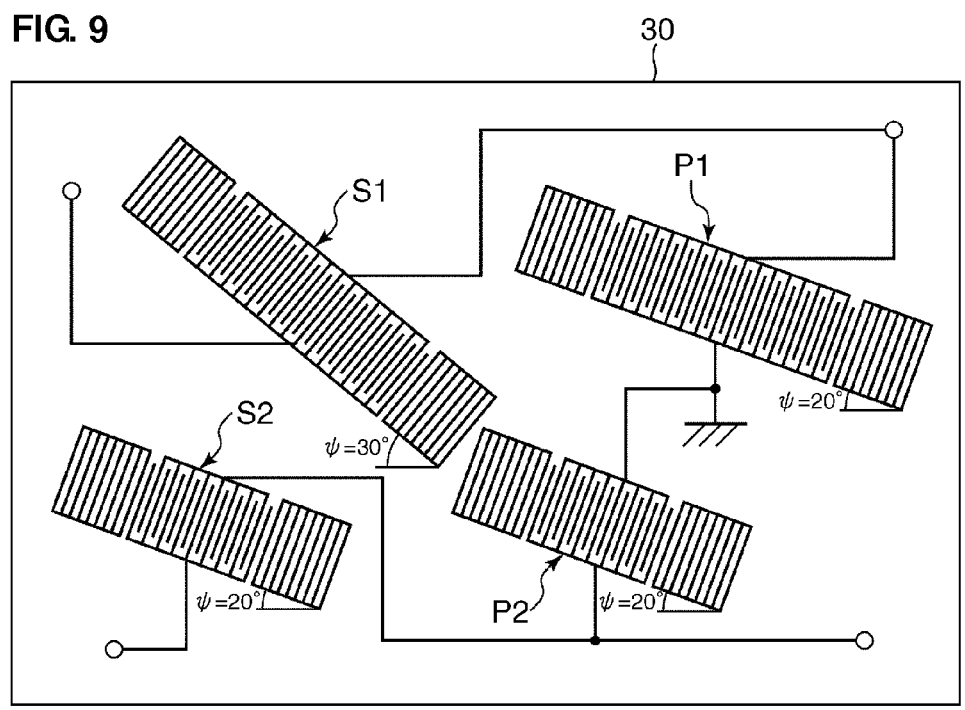
FIG. 9 is a plan view schematically illustrating an elastic wave element according to the second preferred embodiment of the present invention.

FIG. 9 is a plan view schematically illustrating the elastic wave element according to the second preferred embodiment. As shown in FIG. 9, the propagation angle (ψ=30°) of the first series arm resonator S1 which contributes to the formation of the transition band which is located on the lower side relative to the second attenuation band is larger than the propagation angles (ψ=20°) of the second series arm resonator S2 and the first and second parallel arm resonators P1 and P2. Accordingly, the electromechanical coupling coefficient ($k^2$) of the first series arm resonator S1 is smaller than the electromechanical coupling coefficients ($k^2$) of the second series arm resonator S2 and the first and second parallel arm resonators P1 and P2. Consequently, the sharpness of the impedance characteristic of the first series arm resonator S1 is enhanced, and high sharpness of the filter characteristic in the transition band located on the lower side relative to the second attenuation band is attained.

Furthermore, also in this preferred embodiment, the propagation angle (ψ) of the first series arm resonator S1 which contributes to the formation of the transition band is equal to or smaller than 45° and is larger than the propagation angles (ψ) of the other elastic wave resonators, that is, the second series arm resonator S2 and the first and second parallel arm resonators P1 and P2. Therefore, a TCF of the filter characteristic in the transition band is small. Accordingly, when the band rejection filter of the second preferred embodiment is used, a large fabrication tolerance regarding frequencies is obtained, and a high fabrication yield rate is realized.

Note that, in this preferred embodiment, a case where the three inductance elements are arranged in the series arm 10, the two series arm resonators are arranged in the series arm 10, and the two parallel arm resonators are disposed in the first and second parallel arms 13a and 13b is described as an example. However, in the present invention, the number of inductance elements and serial arm resonators which are arranged in the series arm and the number of parallel arm resonators which are disposed in the parallel arms are not restricted. For example, the number of parallel arm resonators disposed in the parallel arms and the number of series arm resonators disposed in the series arm may be the same as each other or may be different from each other. Furthermore, in addition to the first and second parallel arms 13a and 13b, a plurality of parallel arms may be connected and inductance elements may be disposed in the plurality of parallel arms.

SECOND EXAMPLE AND SECOND COMPARATIVE EXAMPLE

A band rejection filter according to a second example corresponding to the second preferred embodiment is fabricated by a method that preferably is the same as the method for fabricating the band rejection filter of the first example. Note that, in the second example, detailed configurations of first and second series arm resonators S1 and S2 and first and second parallel arm resonators P1 and P2 are as shown in Table 2 below.

TABLE 2

|  | S1 | S2 | P1 | P2 |
|---|---|---|---|---|
| Number of pairs of electrode fingers in the IDTs (pair) | 60 | 60 | 48 | 51 |
| Number of pairs of electrode fingers in the reflectors (pair) | 10 | 10 | 10 | 10 |
| wavelength λ (μm) | 4.025 | 3.945 | 3.805 | 3.744 |
| cross width (μm) | 110 | 110 | 112 | 109 |
| IDT duty ratio | 0.60 | 0.60 | 0.60 | 0.60 |
| reflector duty ratio | 0.60 | 0.60 | 0.60 | 0.60 |
| propagation angle ψ (°) | 30 | 10 | 10 | 10 |

A band rejection filter according to a second comparative example is fabricated similarly to the second example except that all propagation angles (ψ) of first and second series arm resonators S1 and S2 and first to second parallel arm resonators P1 and P2 of the second comparative example are set to 10°.

Impedance characteristics of the first and second series arm resonators S1 and S2 and the first to second parallel arm resonators P1 and P2 of the band rejection filter according to the second example are individually measured, and an insertion loss of the band rejection filter according to the second example and an insertion loss of the band rejection filter according to the second comparative example are measured.

Figure 10:
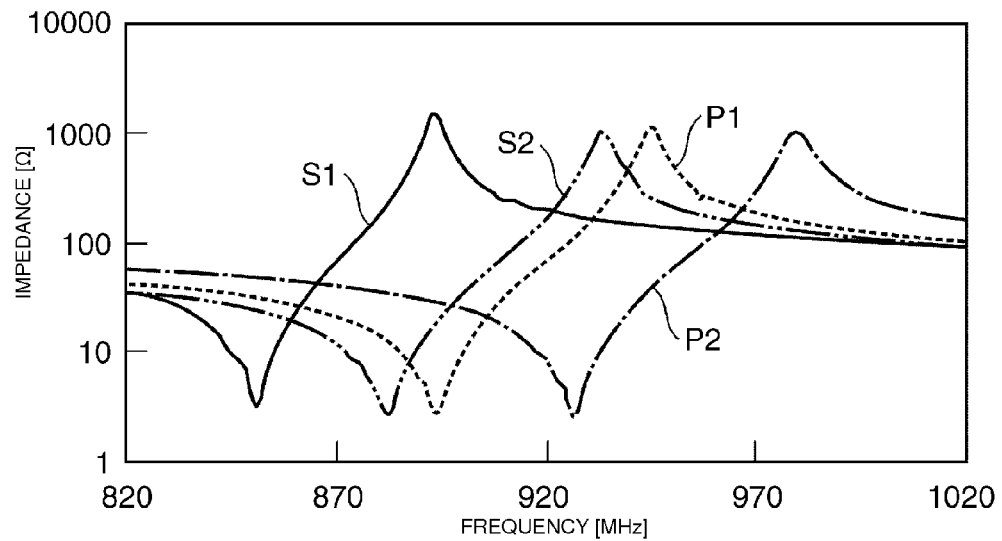
FIG. 10 is a graph illustrating impedance characteristics of parallel arm resonators and series arm resonators according to a second example.

FIG. 10 shows impedance characteristics of the first and second parallel arm resonators P1 and P2 and the first and second series arm resonators S1 and S2 in the band rejection filter according to the second example. In FIG. 10, a solid line denoted by a reference symbol S1 represents the impedance characteristic of the first series arm resonator S1. A chain double-dashed line denoted by a reference symbol S2 represents the impedance characteristic of the second series arm resonator S2. A dotted line denoted by a reference symbol P1 represents the impedance characteristic of the second parallel arm resonator P1. A dashed line denoted by a reference symbol P2 represents the impedance characteristic of the second parallel arm resonator P2.

As shown in FIG. 10, when anti-resonant frequencies of the first and second series arm resonators S1 and S2 and resonant frequencies of the first and second parallel arm resonators P1 and P2 are compared with one another, the anti-resonant frequency of the first series arm resonator S1 is the lowest frequency, and the following inequality is satisfied: (the anti-resonant frequency of the first series arm resonator S1)<(the resonant frequency of the first parallel arm resonator P1)<(the resonant frequency of the second parallel arm resonator P2)< (the anti-resonant frequency of the second series arm resonator S2). Consequently, in the band rejection filter of the second example, the filter characteristic in the transition band is determined by the first series arm resonator S1.

Figure 11:
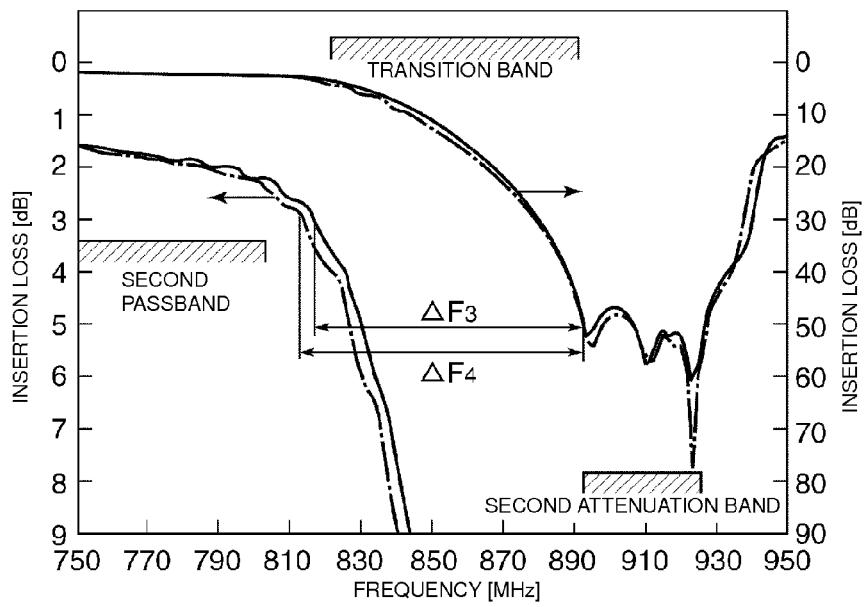
FIG. 11 is a graph illustrating insertion losses of a band rejection filter according to the second example and a band rejection filter according to a second comparative example.

FIG. 11 shows the insertion loss of the band rejection filter according to the second example and the insertion loss of the band rejection filter according to the second comparative example. Solid lines in a graph shown in FIG. 11 represent insertion losses of the band rejection filter of the second example, and dashed lines in the graph shown in FIG. 11 represent insertion losses of the band rejection filter of the second comparative example.

As with the first example, the band rejection filter of the second example is mounted on cellular phones having a function of receiving broadcasting service for mobile devices for digital terrestrial television broadcasting in Japan. Since a band for broadcasting signals of the broadcasting service for mobile devices in Japan corresponds to a UHF band (470 MHz to 770 MHz), a second passband of the band rejection filter of the second example corresponds to a range from approximately 470 MHz to approximately 800 MHz. Furthermore, since a band for transmission signals of cellular phones is included in a range from approximately 800 MHz to approximately 900 MHz, a second attenuation band of the band rejection filter according to the second example corresponds to a range from approximately 898 MHz to approximately 925 MHz.

Accordingly, the band rejection filter of the second example has a function of allowing the broadcasting signals of the broadcasting service for mobile devices to pass toward the TV tuner for receiving the broadcasting service for mobile devices and removing the transmission signals of the cellular phones.

As shown in FIG. 11, the band rejection filter of the second example has higher sharpness of the filter characteristic in the transition band which is located on the lower side relative to the second attenuation band than the band rejection filter of the second comparative example. Specifically, as a difference ($\Delta F$) between a frequency corresponding to an insertion loss of 3 dB on a higher side relative to the second passband and a frequency corresponding to an insertion loss of 50 dB on a lower side relative to the second attenuation band, 66.7 MHz is obtained in the second comparative example ($\Delta F4$) whereas 63.6 MHz is obtained in the second example ($\Delta F3$). That is, the frequency difference ($\Delta F3$) of the second example is smaller than the frequency difference ($\Delta F4$) of the second comparative example by 3.1 MHz. Consequently, it is recognized that the sharpness of the filter characteristic in the transition band which is located on the lower side relative to the second attenuation band can be enhanced by making the propagation angle ($\psi$) of one of the elastic wave resonators, that is, the first and second series arm resonators S1 and S2 and the first and second parallel arm resonators P1 and P2, which has the lowest frequency among the anti-resonant frequencies of the first and second series arm resonators S1 and S2 and the resonant frequencies of the first to second parallel arm resonators P1 and P2, larger than the propagation angles ($\psi$) of the others of the elastic wave resonators.

Furthermore, as with the first example, when the band for transmission signals of cellular phones is included in the vicinity of approximately 1.5 GHz, approximately 1.7 GHz, and approximately 2.0 GHz, since such a band for transmission signals of cellular phones is included in the first attenuation band on a higher band side of the band rejection filter of the second example, the band rejection filter of the second example removes the transmission signals of cellular phones. Therefore, the transmission signals of cellular phones are prevented from being transmitted to the TV tuner for receiving the broadcasting service for mobile devices which is disposed in a later stage of the band rejection filter. As described above, the band rejection filter of the second example can remove not only the transmission signals of cellular phones in the vicinity of a range from approximately 800 MHz to approximately 900 MHz but also transmission signals of cellular phones in the vicinity of approximately 1.5 GHz, approximately 1.7 GHz, and approximately 2.0 GHz. Consequently, the band rejection filter of the second example can reliably prevent interference between the transmission signals of cellular phones and the broadcasting signals of the broadcasting service for mobile devices.

In the band rejection filter of the second preferred embodiment, the first series arm resonator S1 which has the lowest resonant frequency among the anti-resonant frequencies of the first and second series arm resonators S1 and S2 and the resonant frequencies of the first and second parallel arm resonators P1 and P2 and which contributes to formation of the transition band has the propagation angle ($\psi=30°$) larger than the propagation angles ($\psi=20°$) of the second series arm resonator S2 and the first and second parallel arm resonators P1 and P2, and the propagation angles ($\psi$) of the second series arm resonator S2 and the first and second parallel arm resonators P1 and P2 are the same as one another. However, the present invention is not limited to this configuration.

That is, the propagation angles ($\psi$) of the second series arm resonator S2 and the first and second parallel arm resonators P1 and P2 may be different from one another, or any one of the propagation angles ($\psi$) of the second series arm resonator S2 and the first and second parallel arm resonators P1 and P2 may be the same as the propagation angle ($\psi$) of the first series arm resonator S1.

Even in a case where propagation angles ($\psi$) of the first and second series arm resonators S1 and S2 and the first and second parallel arm resonators P1 and P2 are different from one another, or a case where at least one of propagation angles ($\psi$) of the first and second series arm resonators S1 and S2 and the first and second parallel arm resonators P1 and P2 is different from the others of the propagation angles ($\psi$) of the first and second series arm resonators S1 and S2 and the first and second parallel arm resonators P1 and P2, an electromechanical coupling coefficient ($k^2$) of one of the elastic wave resonators which has the lowest frequency and which contributes to the formation of the transition band is smaller than electromechanical coupling coefficients ($k^2$) of the others of the elastic wave resonators by setting the propagation angle ($\psi$) of one of the elastic wave resonators which has the lowest frequency among the anti-resonant frequencies of the first and second series arm resonators S1 and S2 and the resonant frequencies of the first and second parallel arm resonators P1 and P2 and which contributes to the formation of the transition band to be larger than propagation angles ($\psi$) of the others of the elastic wave resonators. Accordingly, as with the second preferred embodiment, sharpness of an impedance characteristic of the elastic wave resonator which has the lowest frequency and which contributes to the formation of the transition band is enhanced, and sharpness of a filter characteristic in the transition band is enhanced.

Furthermore, even in a case where the propagation angles ($\psi$) of the first and second series arm resonators S1 and S2 and the first and second parallel arm resonators P1 and P2 are different from one another, or a case where the propagation angle ($\psi$) of at least one of the elastic wave resonators is different from the propagation angles ($\psi$) of the others of the elastic wave resonators, an electromechanical coupling coefficient ($k^2$) of one of the elastic wave resonators which has the lowest frequency and which contributes to the formation of the transition band is smaller than any one of electromechanical coupling coefficients ($k^2$) of the others of the elastic wave resonators by setting the propagation angle ($\psi$) of one of the elastic wave resonators which has the lowest frequency and which contributes to the formation of the transition band to be larger than at least one of the propagation angles ($\psi$) of the others of the elastic wave resonators. Accordingly, as with the second preferred embodiment, the sharpness of the impedance characteristic of the elastic wave resonator which has the lowest frequency and which contributes to the formation of the transition band is enhanced, and the sharpness of the filter characteristic in the transition band is enhanced.

Third Preferred Embodiment

Figure 12:
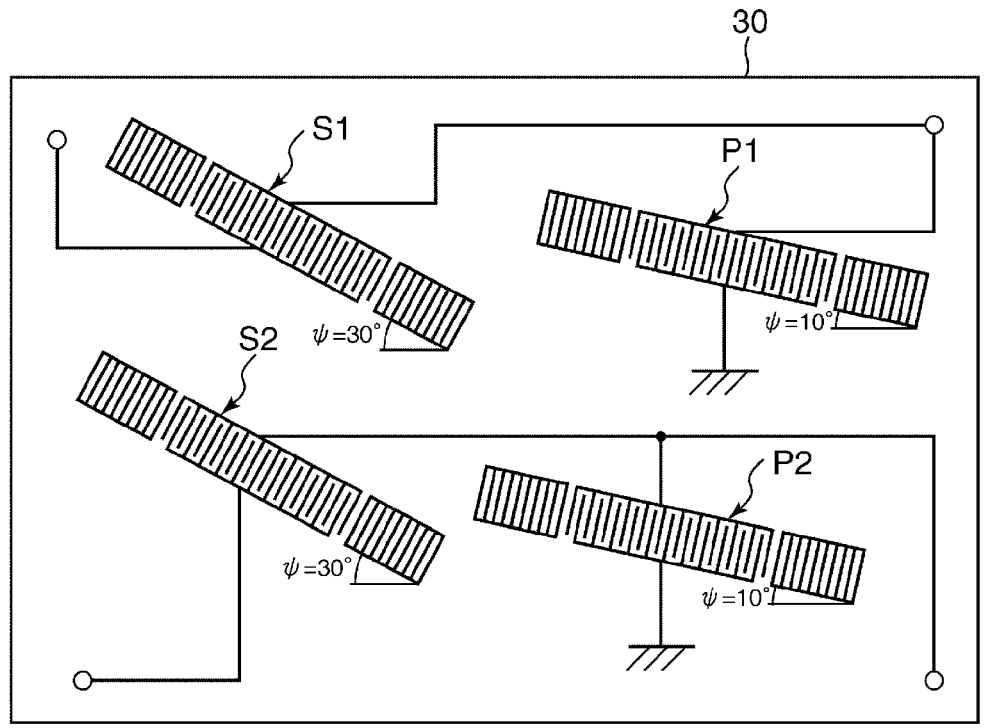
FIG. 12 is a plan view schematically illustrating an elastic wave element according to a third preferred embodiment of the present invention.

FIG. 12 is a plan view schematically illustrating an elastic wave element according to a third preferred embodiment. As shown in FIG. 12, the band rejection filter according to the third preferred embodiment is preferably configured similarly to the band rejection filter according to the second preferred embodiment shown in FIG. 8 except for propagation angles ($\psi$) of first and second series arm resonators S1 and S2 and first and second parallel arm resonators P1 and P2.

Therefore, the band rejection filter according to the third preferred embodiment has first attenuation bands in which an insertion loss is large. The first attenuation bands are respectively formed on a lower side and a higher side. The lower first attenuation band is mainly formed by capacitances of the first and second series arm resonators S1 and S2. The higher first attenuation band is mainly formed by inductances of first to third inductance elements 40 to 42 and capacitances of the first and second parallel arm resonators P1 and P2.

The band rejection filter of the third preferred embodiment has a first passband which is located between the lower first attenuation band and the higher first attenuation band and in which an insertion loss is small. The first passband is mainly formed by the inductances of the first to third inductance elements 40 to 42.

The band rejection filter of the third preferred embodiment has a second attenuation band which is included in the first passband and in which an insertion loss is large. The second attenuation band is mainly formed by attenuation poles generated due to antiresonances of the first and second series arm resonators S1 and S2 and attenuation poles generated due to resonances of the first and second parallel arm resonators P1 and P2.

The band rejection filter of the third preferred embodiment has a second passband which is included in the first passband, which is located on a lower side relative to the second attenuation band, and in which an insertion loss is small. The second passband is mainly formed by the inductances of the first to third inductance elements 40 to 42.

Then, the band rejection filter of the third preferred embodiment has a lower transition band between the second attenuation band and the second passband and a higher transition band on a higher side relative to the second attenuation band.

As shown in FIG. 12, in this preferred embodiment, the propagation angles ($\psi=30°$) of the first and second series arm resonators S1 and S2 are larger than the propagation angles ($\psi=10°$) of the first and second parallel arm resonators P1 and P2. Therefore, electromechanical coupling coefficients ($k^2$) of the first and second series arm resonators S1 and S2 are smaller than electromechanical coupling coefficients ($k^2$) of the first and second parallel arm resonators P1 and P2. Consequently, high sharpness of a filter characteristic in the lower transition band located between the second passband and the second attenuation band is realized.

Moreover, also in this preferred embodiment, the propagation angles ($\psi$) of the first and second series arm resonators S1 and S2 preferably are equal to or smaller than 45° and are larger than the propagation angles ($\psi$) of the first and second parallel arm resonators P1 and P2. Therefore, a TCF of the filter characteristic in the lower transition band between the second passband and the second attenuation band is small. Accordingly, also when the band rejection filter of this preferred embodiment is used, a large fabrication tolerance regarding frequencies is obtained, and a high fabrication yield rate is realized.

THIRD EXAMPLE AND THIRD COMPARATIVE EXAMPLE

A band rejection filter according to a third example corresponding to the third preferred embodiment is preferably fabricated by a method the same as the method for fabricating the band rejection filter of the first example. Note that, in the third example, detailed configurations of first and second series arm resonators S1 and S2 and first and second parallel arm resonators P1 and P2 are as shown in Table 3 below.

TABLE 3

|  | S1 | S2 | P1 | P2 |
| --- | --- | --- | --- | --- |
| Number of pairs of electrode fingers IDTs (pair) | 60 | 60 | 48 | 51 |
| Number of pairs of electrode fingers in the reflectors (pair) | 10 | 10 | 10 | 10 |
| wavelength λ (μm) | 4.025 | 3.945 | 3.805 | 3.744 |
| cross width (μm) | 110 | 110 | 112 | 109 |
| IDT duty ratio | 0.60 | 0.60 | 0.60 | 0.60 |
| reflector duty ratio | 0.60 | 0.60 | 0.60 | 0.60 |

TABLE 3-continued

|  | S1 | S2 | P1 | P2 |
|---|---|---|---|---|
| propagation angle ψ (°) | 30 | 30 | 10 | 10 |

A band rejection filter according to a third comparative example is fabricated similarly to the third example except that all propagation angles (ψ) of first and second series arm resonators S1 and S2 and first to second parallel arm resonators P1 and P2 of the third comparative example are set to 10°.

Next, impedance characteristics (resonant frequencies and anti-resonant frequencies) of the first and second series arm resonators S1 and S2 and the first to second parallel arm resonators P1 and P2 of the band rejection filter according to the third example are individually measured.

In the band rejection filter of this preferred embodiment that is configured such that first to third inductance elements 40 to 42 and the first and second series arm resonators S1 and S2 are arranged in a series arm 10 and the first and second parallel arm resonators P1 and P2 are disposed in first and second parallel arms 13a and 13b, respectively, an elastic wave resonator having the lowest frequency among the anti-resonant frequencies of the first and second series arm resonators S1 and S2 and the resonant frequencies of the first and second parallel arm resonators P1 and P2 contributes to formation of a lower transition band located between a second passband and a second attenuation band. Sharpness of a filter characteristic in the lower transition band located between the second passband and the second attenuation band is determined by frequency characteristics of the series arm resonators, specifically, by the resonant frequencies and the anti-resonant frequencies of the series arm resonators.

Figure 13:
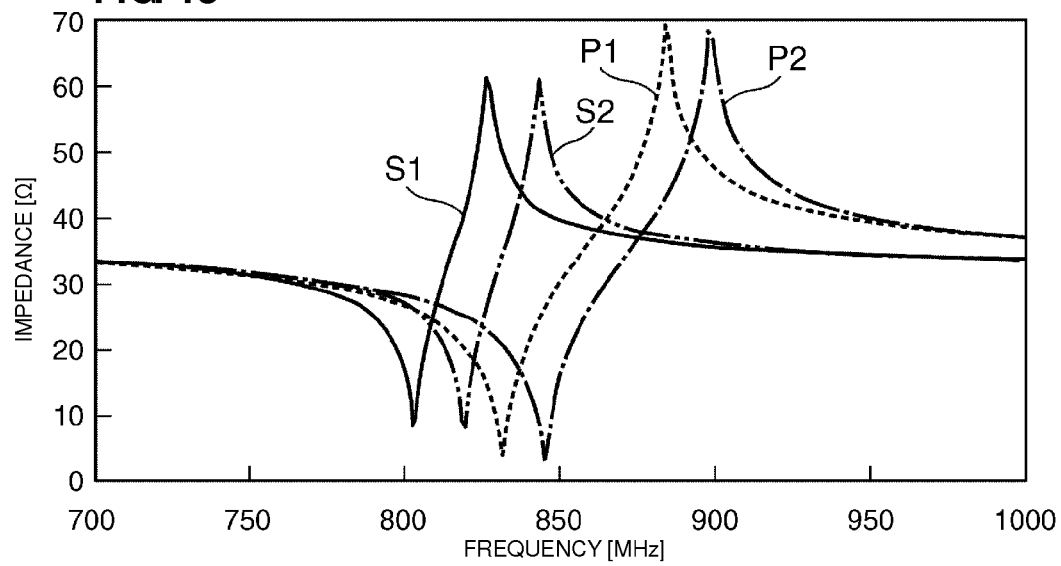
FIG. 13 is a graph illustrating impedance characteristics of parallel arm resonators and series arm resonators according to a third example.

FIG. 13 shows impedance characteristics of the first and second parallel arm resonators P1 and P2 and the first and second series arm resonators S1 and S2 in the band rejection filter according to the third example. In FIG. 13, a solid line denoted by a reference symbol S1 represents the impedance characteristic of the first series arm resonator S1. A chain double-dashed line denoted by a reference symbol S2 represents the impedance characteristic of the second series arm resonator S2. A dotted line denoted by a reference symbol P1 represents the impedance characteristic of the second parallel arm resonator P1. A dashed line denoted by a reference symbol P2 represents the impedance characteristic of the third parallel arm resonator P2.

In the third example, as shown in FIG. 13, when anti-resonant frequencies of the first and second series arm resonators S1 and S2 and resonant frequencies of the first and second parallel arm resonators P1 and P2 are compared with one another, the anti-resonant frequency of the first series arm resonator S1 is the lowest frequency. Therefore, when the anti-resonant frequency of the first series arm resonator S1 is compared with the anti-resonant frequency of the second series arm resonator S2, the anti-resonant frequency of the first series arm resonator S1 is lower. Consequently, it is recognized that the frequency characteristic of the first series arm resonator S1 contributes the most to the filter characteristic in the lower transition band located between the second passband and the second attenuation band, and the frequency characteristic of the second series arm resonator S2 contributes the second most to the filter characteristic in the lower transition band.

Figure 14:
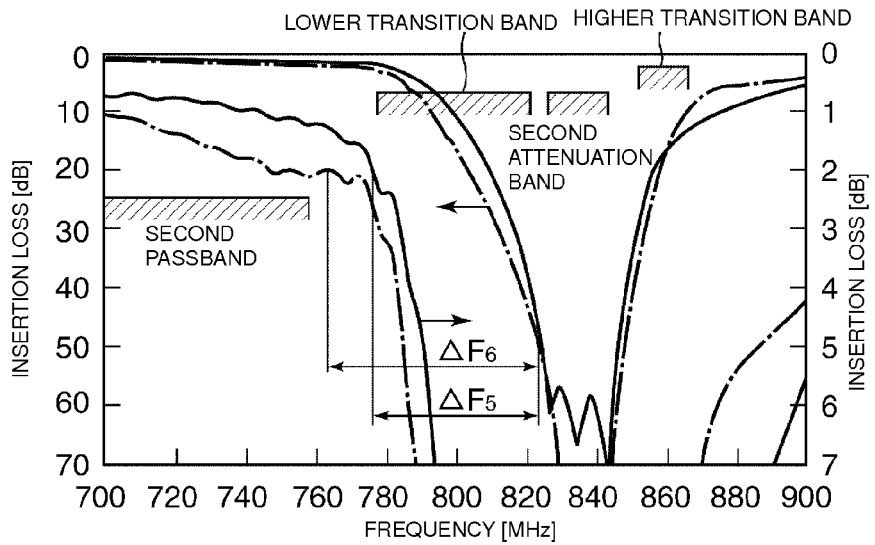
FIG. 14 is a graph illustrating insertion losses of a band rejection filter according to the third example and a band rejection filter according to a third comparative example.

An insertion loss of the obtained band rejection filter of the third example and an insertion loss of the obtained band rejection filter of the third comparative example are measured. Results of the measurement are shown in FIG. 14. Note that, solid lines in a graph shown in FIG. 14 represents insertion losses of the band rejection filter of the third example, and dashed lines in the graph represents insertion losses of the band rejection filter of the third comparative example.

The band rejection filter of the third example, as with the first example, is mounted on cellular phones having a function of receiving broadcasting service for mobile devices of digital terrestrial television broadcasting. The second passband of the band rejection filter of the third example corresponds to a range from approximately 470 MHz to approximately 760 MHz. Furthermore, since a band for transmission signals of cellular phones is included in the vicinity of a range from approximately 800 MHz to approximately 900 MHz, the second attenuation band of the band rejection filter of the third example corresponds to a range from approximately 820 MHz to approximately 850 MHz.

Accordingly, the band rejection filter of the third example has a function of allowing broadcasting signals of the broadcasting service for mobile devices to pass toward the TV tuner for receiving the broadcasting service for mobile devices and removing the transmission signals of the cellular phones.

As shown in FIG. 14, the band rejection filter of the third example has higher sharpness of the filter characteristic in the lower transition band which is located between the second passband and the second attenuation band than the band rejection filter of the third comparative example. Specifically, as a difference (ΔF) between a frequency corresponding to an insertion loss of 2 dB on a higher side relative to the second passband and a frequency corresponding to an insertion loss of 50 dB on a lower side relative to the second attenuation band, 42.7 MHz is obtained in the third comparative example (ΔF6) whereas 37.6 MHz is obtained in the third example (ΔF5). That is, the frequency difference (ΔF5) of the third example is smaller than the frequency difference (ΔF6) of the third comparative example by 5.1 MHz. Consequently, it is recognized that the sharpness of the filter characteristic in the lower transition band which is located between the second passband and the second attenuation band can be enhanced by making the propagation angles (ψ) of the first and second series arm resonators S1 and S2 larger than the propagation angles (ψ) of the first to second parallel arm resonators P1 and P2.

Figure 15:
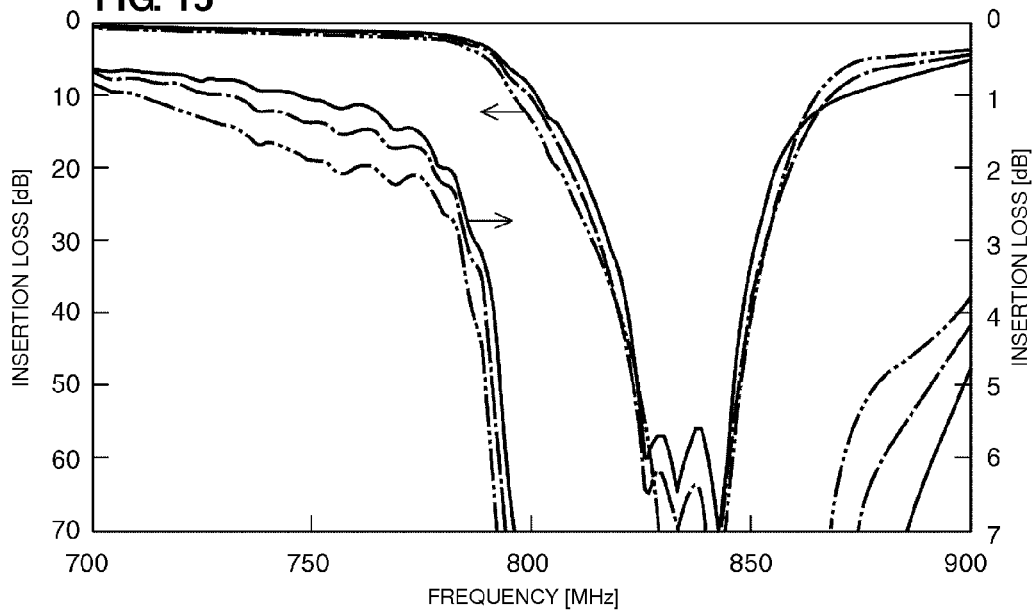
FIG. 15 is a graph illustrating insertion losses of the band rejection filter according to the third example, the band rejection filter according to the third comparative example, and a band rejection filter in which only the propagation angles ($\psi$) of the series arm resonators of the third example are changed.

FIG. 15 is a graph illustrating insertion losses of the band rejection filter according to the third preferred embodiment, the band rejection filter according to the third comparative example, and a band rejection filter in which only the propagation angles (ψ) of the series arm resonators of the third example are changed. Specifically, dashed lines in a graph shown in FIG. 15 represent insertion losses of the band rejection filter in which the first and second series arm resonators S1 and S2 have propagation angles (ψ) of 10° which are the same as those of the first and second parallel arm resonators P1 and P2. Note that solid lines in the graph shown in FIG. 15 represent insertion losses of the band rejection filter according to the third example. Chain double-dashed lines in the graph shown in FIG. 15 represent insertion losses of the band rejection filter according to the third comparative example.

Consequently, as shown in FIG. 15, it is realized that not only the frequency characteristic of the first series arm resonator S1 but also the frequency characteristic of the second series arm resonator S2 contribute the filter characteristic in the lower transition band which is located between the second passband and the second attenuation band. It is recognized that especially the sharpness of the filter characteristic in the lower transition band located between the second passband and the second attenuation band can be enhanced by making the propagation angles (ψ) of the first and second series arm resonators S1 and S2 larger than the propagation angles (ψ) of the first and second parallel arm resonators P1 and P2.

Note that the reason that the sharpness of the filter characteristic in the lower transition band located between the second passband and the second attenuation band can be enhanced by making the propagation angles (ψ) of the first and second series arm resonators S1 and S2 larger than the propagation angles (ψ) of the first and second parallel arm resonators P1 and P2 is described in the following paragraphs.

Figure 16:
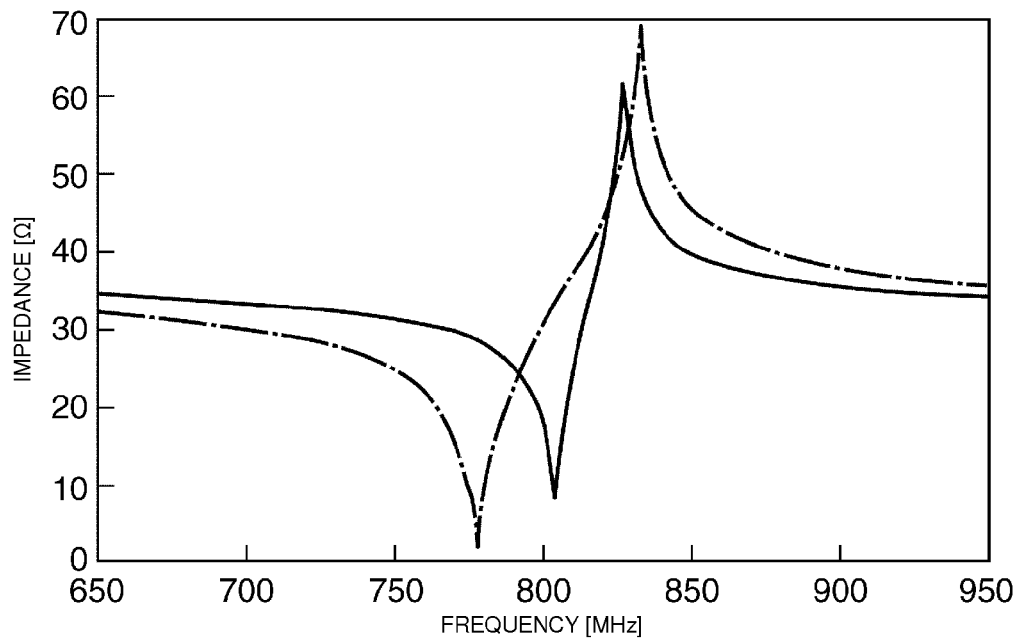
FIG. 16 is a graph illustrating impedance characteristics of elastic wave resonators each of which has a propagation angle ($\psi$) of 30° or 0°.

FIG. 16 is a graph illustrating impedance characteristics of elastic wave resonators having propagation angles (ψ) of 30° and 0°. A solid line in a graph shown in FIG. 16 represents the impedance characteristic of the elastic wave resonator having the propagation angle (ψ) of 30°. A dashed line in the graph represents the impedance characteristic of the elastic wave resonator having the propagation angle (ψ) of 0°.

As is apparent from FIG. 16, when a large propagation angle (ψ) of an elastic resonator is set so that a small electromechanical coupling coefficient ($k^2$) of the elastic wave resonator is obtained, a resonant frequency and an anti-resonant frequency of the elastic wave resonator are close to each other. Therefore, sharpness of an impedance characteristic is enhanced. Accordingly, the sharpness of the filter characteristic in the transition band can be enhanced by making the propagation angles (ψ) of the first and second series arm resonators S1 and S2 which contribute the formation of the transition band larger than the propagation angles (ψ) of the first and second parallel arm resonators P1 and P2.

Furthermore, as with the first example, even when the band for transmission signals of cellular phones is included in the vicinity of approximately 1.5 GHz, approximately 1.7 GHz, and approximately 2.0 GHz, since such a band for transmission signals of cellular phones is included in the first attenuation band on a higher side in the band rejection filter of the third example, the band rejection filter of the third example removes the transmission signals of cellular phones. Therefore, the transmission signals of cellular phones are prevented from being transmitted to the TV tuner for receiving broadcasting service for mobile devices which is disposed in a later stage of the band rejection filter. As described above, the band rejection filter of the third example can remove not only the transmission signals of cellular phones in the vicinity of a range from approximately 800 MHz to approximately 900 MHz but also the transmission signals of cellular phones in the vicinity of approximately 1.5 GHz, approximately 1.7 GHz, and approximately 2.0 GHz. Consequently, the band rejection filter of the third example can reliably prevent interference between the transmission signals of cellular phones and the broadcasting signals of the broadcasting service for mobile devices.

In the band rejection filter of the third preferred embodiment, the propagation angle (ψ=30°) of the first series arm resonator S1 which has the lowest frequency among the anti-resonant frequencies of the first and second series arm resonators S1 and S2 and the resonant frequencies of the first and second parallel arm resonators P1 and P2 and which contributes to the formation of the transition band and the propagation angle (ψ=30°) of the second series arm resonator S2 are larger than the propagation angle (ψ=10°) of the first and second parallel arm resonators P1 and P2. In addition, the propagation angles (ψ) of the first and second parallel arm resonators P1 and P2 are the same as each other. However, the present invention is not limited to such a configuration.

That is, the propagation angles (ψ) of the first and second parallel arm resonators P1 and P2 may be different from each other, or one of the propagation angles (ψ) of the first and second parallel arm resonators P1 and P2 may be the same as the propagation angles (ψ) of the first and second series arm resonators S1 and S2.

Fourth Preferred Embodiment

Figure 17:
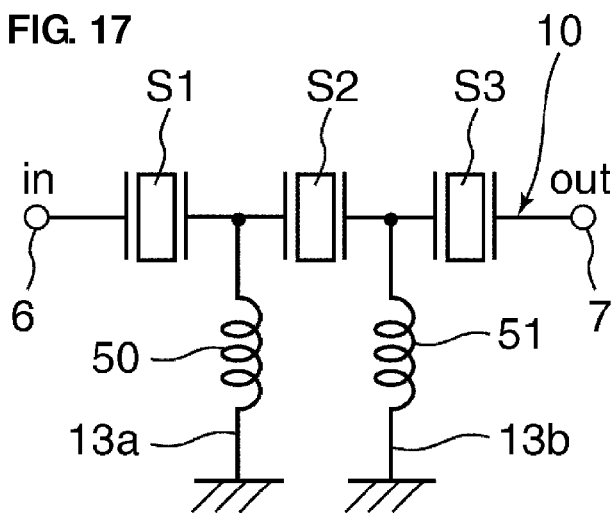
FIG. 17 is a circuit diagram illustrating a band rejection filter according to a fourth preferred embodiment of the present invention.

FIG. 17 is a circuit diagram illustrating a band rejection filter according to a fourth preferred embodiment. As shown in FIG. 17, the band rejection filter according to the fourth preferred embodiment includes a ladder circuit having a series arm 10 which connects an input terminal 6 and an output terminal 7 to each other and first and second parallel arms 13a and 13b which are connected between the series arm 10 and the ground potential.

In the band rejection filter according to the fourth preferred embodiment, first to third series arm resonators S1 to S3 are arranged in the series arm 10. Between the series arm 10 and the ground potential, the first and second parallel arms 13a and 13b are connected. Specifically, the first parallel arm 13a is connected between the ground potential and a point of connection between the first series arm resonator S1 and the second series arm resonator S2 in the series arm 10. In the first parallel arm 13a, a first inductance element 50 is disposed. On the other hand, the second parallel arm 13b is connected between the ground potential and a point of connection between the second series arm resonator S2 and the third series arm resonator S3. In the second parallel arm 13b, a second inductance element 51 is disposed.

As described above, in this preferred embodiment, the ladder circuit is configured by the first to third series arm resonators S1 to S3 arranged in the series arm 10 and the first and second inductance elements 50 and 51 disposed in the first and second parallel arms 13a and 13b, respectively. Note that, in this preferred embodiment, as with the first preferred embodiment, the first and second series arm resonators S1 and S2 and the first and second parallel arm resonators P1 and P2 are preferably integrally formed as a single elastic wave element.

The band rejection filter of the fourth preferred embodiment has a first attenuation band in which an insertion loss is large. The first attenuation band is mainly formed by inductances of the first and second inductance elements 50 and 51 and capacitances of the first to third series arm resonators S1 to S3.

The band rejection filter according to the fourth preferred embodiment has a first passband which is located on a higher side relative to the first attenuation band and in which in insertion loss is small. The first passband is mainly formed by the inductances of the first and second inductance elements 50 and 51.

The band rejection filter according to the fourth preferred embodiment has a second attenuation band which is included in the first passband and in which an insertion loss is large. The second attenuation band is mainly formed by attenuation poles generated due to antiresonances of the first to third series arm resonators S1 to S3.

The band rejection filter according to the fourth preferred embodiment has a second passband which is included in the first passband, which is located on a lower side relative to the second attenuation band, and in which in insertion loss is small. The second passband is mainly formed by the inductances of the first and second inductance elements 50 and 51.

Then, the band rejection filter according to the fourth preferred embodiment has a lower transition band between the second attenuation band and the second passband and a higher transition band on a higher side relative to the second attenuation band.

In this preferred embodiment, a propagation angle (ψ) of at least one of the first to third series arm resonators S1 to S3 is larger than propagation angles (ψ) of the others of the first to third series arm resonators S1 to S3. Specifically, the propagation angle (ψ) of at least one of the first to third series arm resonators S1 to S3 which contributes to formation of the transition bands is larger than the propagation angles (ψ) of the others of the first to third series arm resonators S1 to S3. Accordingly, an electromechanical coupling coefficient ($k^2$) of at least one of the series arm resonators which contributes to the formation of the transition bands is smaller than electromechanical coupling coefficients ($k^2$) of the others of the serial arm resonators.

As described in this preferred embodiment, since the propagation angle (ψ) of at least one of the first to third series arm resonators S1 to S3 which contributes to the formation of the transition bands is larger than the propagation angles (ψ) of the others of the first to third series arm resonators S1 to S3, sharpness of a filter characteristic at ends of the passbands can be enhanced while an attenuation amount is ensured by making the electromechanical coupling coefficient ($k^2$) of at least one of the series arm resonators which contributes to the formation of the transition bands smaller than the electromechanical coupling coefficients ($k^2$) of the others of the serial arm resonators. Furthermore, small insertion losses in the passbands can be attained.

In the band rejection filter configured as this preferred embodiment such that the first to third series arm resonators S1 to S3 are arranged in the series arm 10, and the first and second inductance elements 50 and 51 are disposed in the first and second parallel arms 13a and 13b, respectively, the series arm resonator having the highest anti-resonant frequency contributes to the formation of the transition band.

Therefore, in this preferred embodiment, the propagation angle (ψ) of at least one of the first to third series arm resonators S1 to S3 which has the highest anti-resonant frequencies among the anti-resonant frequencies of the first to third series arm resonators S1 to S3 is larger than propagation angles (ψ) of the others of the first to third series arm resonators, and accordingly, the electromechanical coupling coefficient ($k^2$) of at least one of the series arm resonators which has the highest anti-resonant frequency is smaller than the electromechanical coupling coefficients ($k^2$) of the others of the serial arm resonators. Accordingly, the high sharpness of the filter characteristic in the higher transition band which is located on the higher side of the second attenuation band is enhanced.

Specifically, in this preferred embodiment, the third series arm resonator S3 has the highest anti-resonant frequency among the anti-resonant frequencies of the first to third series arm resonators S1 to S3. Therefore, the third series arm resonator S3 contributes to the formation of the higher transition band which is located on the higher side of the attenuation band.

Figure 18:
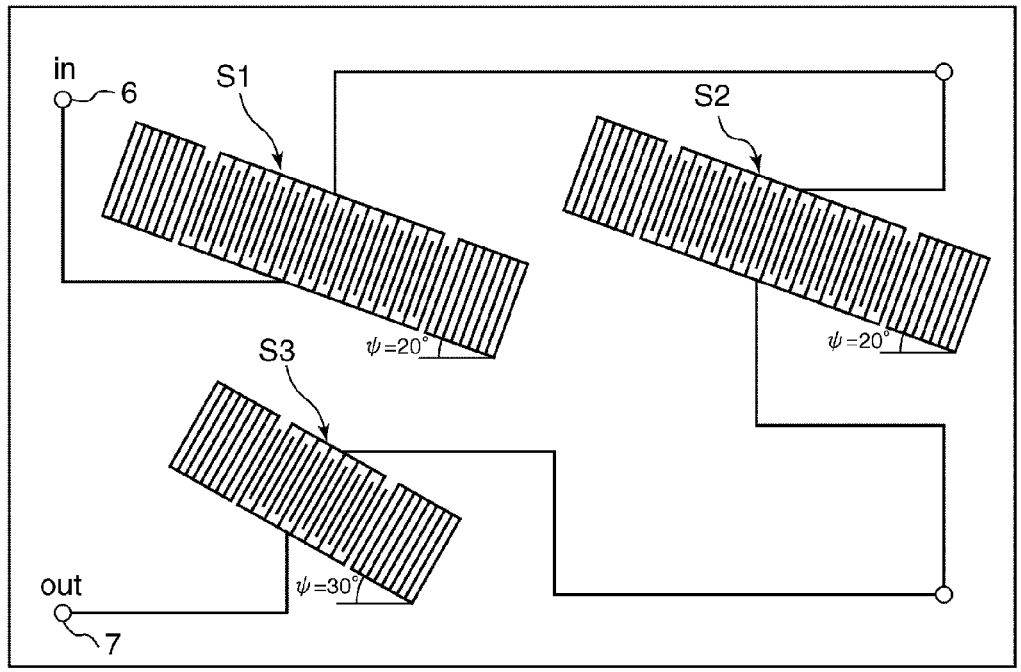
FIG. 18 is a plan view schematically illustrating an elastic wave element according to the fourth preferred embodiment of the present invention.

FIG. 18 is a plan view schematically illustrating the elastic wave element according to the fourth preferred embodiment. As shown in FIG. 18, a propagation angle (ψ=30°) of the third series arm resonator S3 which contributes to the formation of the higher transition band which is located on the higher side relative to the second attenuation band is larger than propagation angles (ψ=20°) of the other series arm resonators, that is, the first and second series arm resonators S1 and S2. Accordingly, an electromechanical coupling coefficient ($k^2$) of the third series arm resonator S3 is smaller than electromechanical coupling coefficients ($k^2$) of the first and second series arm resonators S1 and S2. As a result, the high sharpness of the filter characteristic in the higher transition band which is located on the higher side relative to the second attenuation band is realized.

Furthermore, also in this preferred embodiment, the propagation angle (ψ) of the third series arm resonator S3 which contributes to the formation of the higher transition band which is located on the higher side relative to the second attenuation band is equal to or smaller than 45° and is larger than the propagation angles (ψ) of the first and second series arm resonators S1 and S2. Therefore, a TCF of the filter characteristic in the higher transition band which is located on the higher side relative to the second attenuation band is small. Accordingly, when the band rejection filter of this preferred embodiment is used, a large fabrication tolerance regarding frequencies is obtained, and a high fabrication yield rate is realized.

Note that, in this preferred embodiment, a case where the three series arm resonators are arranged in the series arm 10 and the two inductance elements are disposed in the first and second parallel arms 13a and 13b is described as an example. However, in this preferred embodiment, the number of series arm resonators arranged in the series arm and the number of inductance elements disposed in the parallel arms are not restricted.

FOURTH EXAMPLE AND FOURTH COMPARATIVE EXAMPLE

A band rejection filter according to a fourth example corresponding to the fourth preferred embodiment is fabricated preferably by a method the same as the method for fabricating the band rejection filter of the first example. Note that, in the fourth example, detailed configurations of first to third series arm resonators S1 to S3 and are as shown in Table 4 below.

TABLE 4

|  | S1 | S2 | P3 |
|---|---|---|---|
| Number of pairs of electrode fingers in the IDTs (pair) | 89 | 83 | 90 |
| Number of pairs of electrode fingers in the reflectors (pair) | 4.5 | 4.5 | 4.5 |
| wavelength λ (μm) | 2.2529 | 2.2647 | 2.2216 |
| cross width (μm) | 63 | 47 | 78 |
| IDT duty ratio | 0.40 | 0.40 | 0.40 |
| reflector duty ratio | 0.40 | 0.40 | 0.40 |
| propagation angle ψ (°) | 10 | 10 | 30 |

A band rejection filter according to a fourth comparative example is fabricated similarly to the fourth example except that all propagation angles (ψ) of first to third series arm resonators S1 to S3 of the fourth comparative example are set to 10°.

Impedance characteristics of the first to third series arm resonators S1 to S3 of the band rejection filter according to the fourth example are individually measured, and insertion losses of the band rejection filter according to the fourth example and the band rejection filter according to the fourth comparative example are measured.

Figure 19:
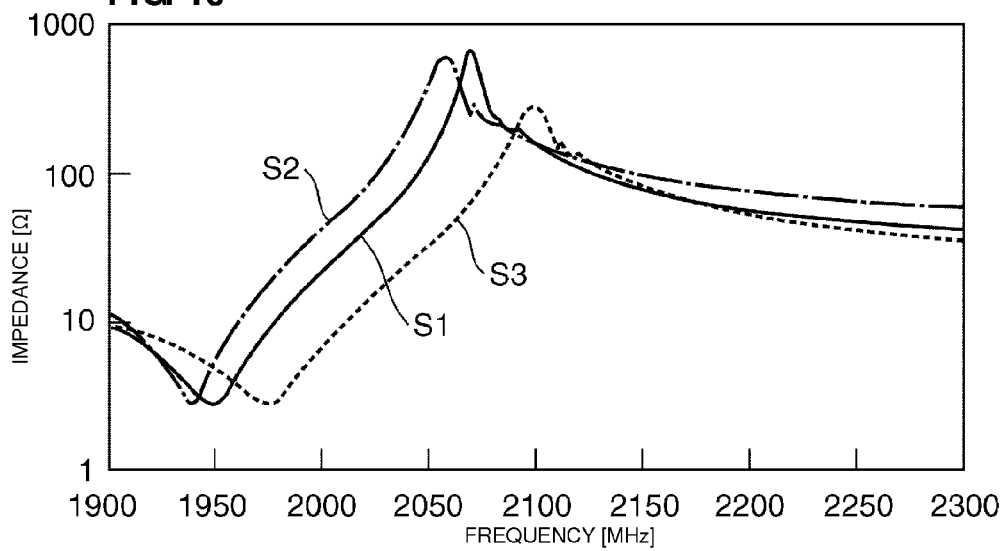
FIG. 19 is a graph illustrating impedance characteristics of series arm resonators according to a fourth example.

FIG. 19 is a graph illustrating impedance characteristics of the first to third series arm resonators S1 to S3 according to the fourth example. In FIG. 19, a solid line denoted by a reference symbol S1 represents the impedance characteristic of the first series arm resonator S1. A dashed line denoted by a reference symbol S2 represents the impedance characteristic of the second series arm resonator S2. A dotted line denoted by a reference symbol S3 represents the impedance characteristic of the third series arm resonator S3.

As shown in FIG. 19, when anti-resonant frequencies of the first to third series arm resonators S1 to S3 are compared with one another, the following inequality is satisfied: (the anti-resonant frequency of the second series arm resonator S2)< (the anti-resonant frequency of the first series arm resonator S1)<(the anti-resonant frequency of the third series arm resonator S3). Consequently, in the band rejection filter of the fourth example, the filter characteristic in a higher transition band which is located on a higher side relative to a second attenuation band is determined by the third series arm resonator S3 which has the highest anti-resonant frequency.

Figure 20:
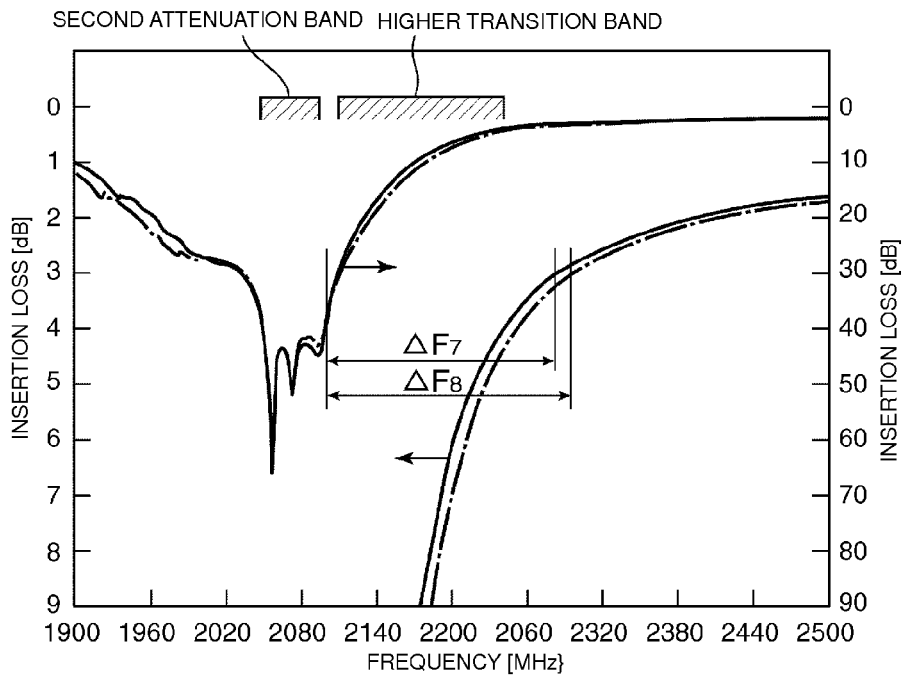
FIG. 20 is a graph illustrating insertion losses of the band rejection filter according to the fourth example and a band rejection filter according to a fourth comparative example.

FIG. 20 is a graph illustrating results of the measurement of the insertion losses of the band rejection filter according to the fourth example and the band rejection filter according to the fourth comparative example. Solid lines in a graph shown in FIG. 20 represent insertion losses of the band rejection filter of the fourth example, and dashed lines in the graph shown in FIG. 20 represent insertion losses of the band rejection filter of the fourth comparative example.

As shown in FIG. 20, the band rejection filter of the fourth example has higher sharpness of a filter characteristic in the higher transition band which is located on the higher side relative to the second attenuation band than the band rejection filter of the fourth comparative example. Specifically, as a difference ($\Delta F$) between a frequency corresponding to an insertion loss of 3 dB on a higher side relative to the second attenuation band included in the first passband and a frequency corresponding to an insertion loss of 40 dB on the higher side relative to the second attenuation band, 197.4 MHz is obtained in the fourth comparative example ($\Delta F8$) whereas 185.7 MHz is obtained in the fourth example ($\Delta F7$). That is, the frequency difference ($\Delta F7$) of the fourth example is smaller than the frequency difference ($\Delta F8$) of the fourth comparative example by 11.7 MHz. Consequently, it is recognized that the sharpness of the filter characteristic in the higher transition band which is located on the higher side relative to the second attenuation band can be enhanced by making the propagation angle ($\psi$) of the third series arm resonator S3 which has the highest anti-resonant frequency larger than the propagation angles ($\psi$) of the first and second series arm resonators S1 and S2.

In the band rejection filter according to the fourth preferred embodiment, the propagation angle ($\psi=30°$) of the third series arm resonator S3 which has the highest anti-resonant frequency and which contributes to formation of the higher transition band is larger than the propagation angles ($\psi=20°$) of the first and second series arm resonators S1 and S2, and the propagation angles ($\psi$) of the first and second series arm resonators S1 and S2 are the same as each other. However, the present invention is not restricted by this configuration. That is, the propagation angles ($\psi$) of the first and second series arm resonators S1 and S2 may be different from each other, and one of the propagation angles ($\psi$) of the first and second series arm resonators S1 and S2 may be the same as the propagation angle ($\psi$) of the third series arm resonator S3.

Even in a case where propagation angles ($\psi$) of a plurality of series arm resonators are different from one another, or a case where a propagation angle ($\psi$) of at least one of series arm resonators is different from propagation angles ($\psi$) of the others of the series arm resonators, an electromechanical coupling coefficient ($k^2$) of at least one of the series arm resonators which contributes to formation of a higher transition band is smaller than electromechanical coupling coefficients ($k^2$) of the others of the series arm resonators by setting the propagation angle ($\psi$) of the series arm resonator which contributes to the formation of the higher transition band to be larger than the propagation angles ($\psi$) of the other series arm resonators. Accordingly, as with the fourth preferred embodiment, the sharpness of the impedance characteristic of the series arm resonator which has the highest anti-resonant frequency and which contributes to the formation of the higher transition band is enhanced, and the sharpness of the filter characteristic in the transition band is enhanced.

Furthermore, even in a case where propagation angles ($\psi$) of a plurality of series arm resonators are different from one another, or a case where a propagation angle ($\psi$) of at least one of series arm resonators is different from propagation angles ($\psi$) of the others of the series arm resonators, an electromechanical coupling coefficient ($k^2$) of at least one of the series arm resonators which has the highest anti-resonant frequency and which contributes to the formation of the higher transition band is smaller than at least one of electromechanical coupling coefficients ($k^2$) of the others of the series arm resonators by setting the propagation angle ($\psi$) of the series arm resonator which contributes to the formation of the higher transition band to be larger than any one of the propagation angles ($\psi$) of the others of the series arm resonators. Accordingly, as with the fourth preferred embodiment, the sharpness of the impedance characteristic of the series arm resonator which has the highest anti-resonant frequency and which contributes to the formation of the transition band is enhanced, and the sharpness of the filter characteristic in the transition band is enhanced.

Fifth Preferred Embodiment

Figure 21:
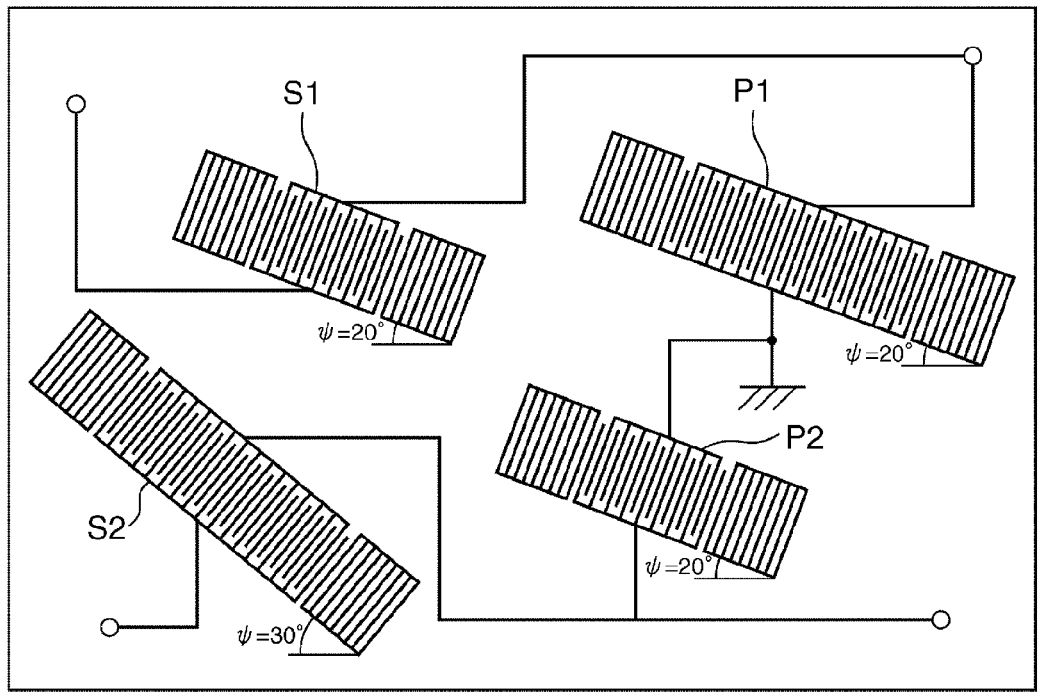
FIG. 21 is a plan view schematically illustrating an elastic wave element according to a fifth preferred embodiment of the present invention.

FIG. 21 is a plan view schematically illustrating an elastic wave element according to a fifth preferred embodiment. As shown in FIG. 21, the band rejection filter according to the fifth preferred embodiment is preferably configured similarly to the band rejection filter according to the second preferred embodiment shown in FIG. 8 except for propagation angles ($\psi$) of first and second series arm resonators S1 and S2 and first and second parallel arm resonators P1 and P2.

Therefore, the band rejection filter according to the fifth preferred embodiment has first attenuation bands in which an insertion loss is large. The first attenuation bands are respectively formed on a lower side and a higher side. The lower first attenuation band is mainly formed by capacitances of the first and second series arm resonators S1 and S2. The higher first attenuation band is mainly formed by inductances of first to third inductance elements 40 to 42 and capacitances of the first and second parallel arm resonators P1 and P2.

The band rejection filter of the fifth preferred embodiment has a first passband which is located between the lower first attenuation band and the higher first attenuation band and in which an insertion loss is small. The first passband is mainly formed by the inductances of the first to third inductance elements 40 to 42.

The band rejection filter of the fifth preferred embodiment has a second attenuation band which is included in the first passband and in which an insertion loss is large. The second attenuation band is mainly formed by attenuation poles generated due to antiresonances of the first and second series arm resonators S1 and S2 and attenuation poles generated due to resonances of the first and second parallel arm resonators P1 and P2.

The band rejection filter of the fifth preferred embodiment has a second passband which is included in the first passband, which is located on a lower side relative to the second attenuation band, and in which an insertion loss is small. The second passband is mainly formed by the inductances of the first to third inductance elements 40 to 42.

Then, the band rejection filter of the fifth preferred embodiment has a lower transition band between the second attenuation band and the second passband and a higher transition band on a higher side relative to the second attenuation band.

In this preferred embodiment, a propagation angle (ψ) of at least one of the first and second series arm resonators S1 and S2 and the first and second parallel arm resonators P1 and P2 is larger than propagation angles (ψ) of the others of the elastic wave resonators. Specifically, the propagation angle (ψ) of at least one of the first and second series arm resonators S1 and S2 and the first and second parallel arm resonators P1 and P2 which contributes to formation of the transition bands is larger than the propagation angles (ψ) of the others of the elastic wave resonators. Accordingly, an electromechanical coupling coefficient ($k^2$) of at least one of the series arm resonators which contributes to the formation of the transition bands is smaller than electromechanical coupling coefficients ($k^2$) of the others of the serial arm resonators.

As described in this preferred embodiment, since the propagation angle (ψ) of at least one of the first and second series arm resonators S1 and S2 and the first and second parallel arm resonators P1 and P2 which contributes to the formation of the transition band is larger than the propagation angles (ψ) of the others of the elastic wave resonators, sharpness of a filter characteristic at ends of the passbands can be enhanced while an attenuation amount is ensured by making the electromechanical coupling coefficient ($k^2$) of at least one of the elastic wave resonators which contributes to the formation of the transition bands smaller than the electromechanical coupling coefficients ($k^2$) of the others of the elastic wave resonators. Furthermore, small insertion losses in the passbands can be attained.

In this preferred embodiment, the propagation angle (ψ) of at least one of the first and second series arm resonators S1 and S2 and the first and second parallel arm resonators P1 and P2 which has the highest frequency among the anti-resonant frequencies of the first and second series arm resonators S1 and S2 and the resonant frequencies of the first and second parallel arm resonators P1 and P2 is larger than the propagation angles (ψ) of the others of the elastic wave resonators, and accordingly, the electromechanical coupling coefficient ($k^2$) of at least one of the elastic wave resonators which has the highest frequency is smaller than the electromechanical coupling coefficients ($k^2$) of the others of the elastic wave resonators. Accordingly, high sharpness of a filter characteristic in the higher transition band which is located on the higher side relative to the second attenuation band is enhanced.

Specifically, in the band rejection filter of this preferred embodiment configured such that the first to third inductance elements 40 to 42 and the first and second series arm resonators S1 and S2 are arranged in a series arm 10 and the first and second parallel arm resonators P1 and P2 are arranged in first and second parallel arms 13a and 13b, respectively, the elastic wave resonator having the highest frequency selected from among the anti-resonant frequencies of the first and second series arm resonators S1 and S2 and the resonant frequencies of the first and second parallel arm resonators P1 and P2 contributes to the formation of the higher transition band which is located on the higher side relative to the second attenuation band.

In this preferred embodiment, among the anti-resonant frequencies of the first and second series arm resonators S1 and S2 and the resonant frequencies of the first and second parallel arm resonators P1 and P2, the anti-resonant frequency of the second series arm resonator S2 is the highest frequency. Therefore, the second series arm resonator S2 contributes to the formation of the higher transition band which is located on the higher side relative to the second attenuation band.

As shown in FIG. 21, a propagation angle (ψ=30°) of the second series arm resonator S2 which contributes to the formation of the higher transition band which is located on the higher side relative to the second attenuation band is larger than propagation angles (ψ=20°) of the first series arm resonator S1 and the first and second parallel arm resonators P1 and P2. Therefore, an electromechanical coupling coefficient ($k^2$) of the second series arm resonator S2 is smaller than electromechanical coupling coefficients ($k^2$) of the first series arm resonator S1 and the first and second parallel arm resonators P1 and P2. As a result, sharpness of an impedance characteristic of the second series arm resonator S2 is enhanced, and high sharpness of a filter characteristic in the higher transition band which is located on the higher side relative to the second attenuation band is realized.

Furthermore, also in this preferred embodiment, the propagation angle (ψ) of the second series arm resonator S2 which contributes to the formation of the higher transition band which is located on the higher side relative to the second attenuation band is equal to or smaller than 45° and is larger than the propagation angles (ψ) of the other elastic wave resonators, that is, the first series arm resonator S1 and the first and second parallel arm resonators P1 and P2. Therefore, a TCF of the filter characteristic in the higher transition band which is located on the higher side relative to the second attenuation band is small. Accordingly, when the band rejection filter of this preferred embodiment is used, a large fabrication tolerance regarding frequencies is obtained, and a high fabrication yield rate is realized.

Note that, in this preferred embodiment, a case where the three inductance elements and the two series arm resonators are arranged in the series arm 10 and the two parallel arm resonators are disposed in the first and second parallel arms 13a and 13b is described as an example. However, in this preferred embodiment, the number of inductance elements and the series arm resonators arranged in the series arm and the number of parallel arm resonators arranged in the parallel arms are not restricted. For example, the number of parallel arm resonators disposed in the parallel arms and the number of series arm resonators arranged in the series arm may be the same as each other or may be different from each other. Furthermore, in addition to the first and second parallel arms 13a and 13b, a plurality of parallel arms may be further connected and inductance elements may be disposed in the plurality of parallel arms.

FIFTH EXAMPLE AND FIFTH COMPARATIVE EXAMPLE

A band rejection filter according to a fifth example corresponding to the fifth preferred embodiment is fabricated preferably by a method the same as the method for fabricating the band rejection filter of the first example. Note that, in the fifth example, detailed configurations of first and second series arm resonators S1 and S2 and first and second parallel arm resonators P1 and P2 are as shown in Table 5 below.

TABLE 5

|  | S1 | P1 | P2 | S2 |
| --- | --- | --- | --- | --- |
| Number of pairs of electrode | 160 | 45 | 85 | 130 |

TABLE 5-continued

| | S1 | P1 | P2 | S2 |
|---|---|---|---|---|
| fingers in the IDTs (pair) | | | | |
| Number of pairs of electrode fingers in the reflectors (pair) | 16.5 | 16.5 | 16.5 | 16.5 |
| wavelength λ (μm) | 2.5768 | 2.4965 | 2.4682 | 2.5882 |
| cross width (μm) | 160 | 45 | 85 | 130 |
| IDT duty ratio | 0.64 | 0.64 | 0.64 | 0.64 |
| reflector duty ratio | 0.64 | 0.64 | 0.64 | 0.64 |
| propagation angle ψ (°) | 20 | 20 | 20 | 30 |

A band rejection filter according to a fifth comparative example is fabricated similarly to the fifth example except that all propagation angles (ψ) of first and second series arm resonators S1 and S2 and first to second parallel arm resonators P1 and P2 of the fifth comparative example are set to 20°.

Impedance characteristics of the first and second series arm resonators S1 and S2 and the first to second parallel arm resonators P1 and P2 of the band rejection filter according to the fifth example are individually measured, and an insertion loss of the band rejection filter according to the fifth example and an insertion loss of the band rejection filter according to the fifth comparative example are measured.

Figure 22:
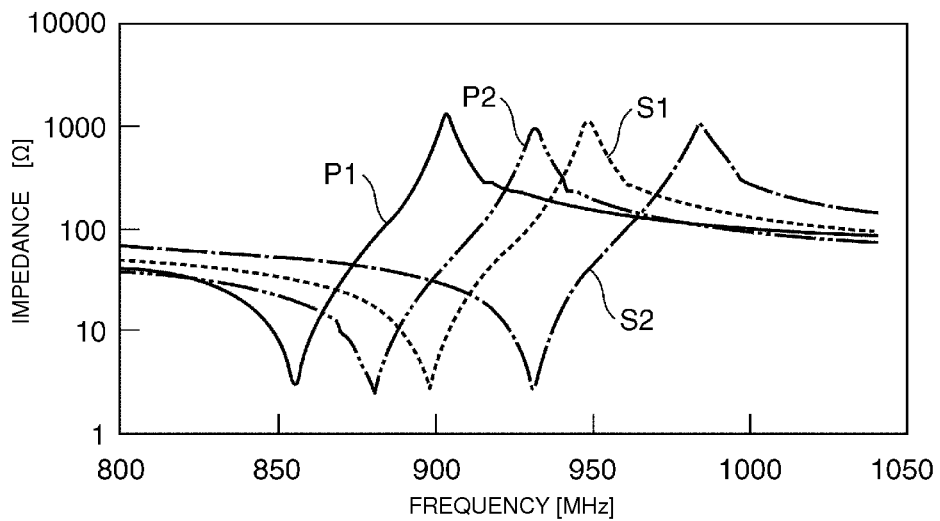
FIG. 22 is a graph illustrating impedance characteristics of series arm resonators and parallel arm resonators according to a fifth example.

FIG. 22 shows impedance characteristics of the first and second series arm resonators S1 and S2 and the first and second parallel arm resonators P1 and P2 of the band rejection filter according to the fifth example. In FIG. 22, a solid line denoted by a reference symbol P1 represents the impedance characteristic of the first parallel arm resonator P1. A chain double-dashed line denoted by a reference symbol P2 represents the impedance characteristic of the second parallel arm resonator P2. A dotted line denoted by a reference symbol S1 represents the impedance characteristic of the first series arm resonator S1. A dashed line denoted by a reference symbol S2 represents the impedance characteristic of second parallel arm resonator S2.

As shown in FIG. 22, when anti-resonant frequencies of the first and second series arm resonators S1 and S2 and resonant frequencies of the first and second parallel arm resonators P1 and P2 are compared with one another, the anti-resonant frequency of the second series arm resonator S2 is the highest frequency, and the following inequality is satisfied: (the resonant frequency of the first parallel arm resonator P1)<(the resonant frequency of the second parallel arm resonator P2)<(the anti-resonant frequency of the first series arm resonator S1)<(the anti-resonant frequency of the second series arm resonator S2). Consequently, in the band rejection filter of the fifth example, a filter characteristic in a higher transition band which is located on a higher side relative to a second attenuation band is determined by the second series arm resonator S2.

Figure 23:
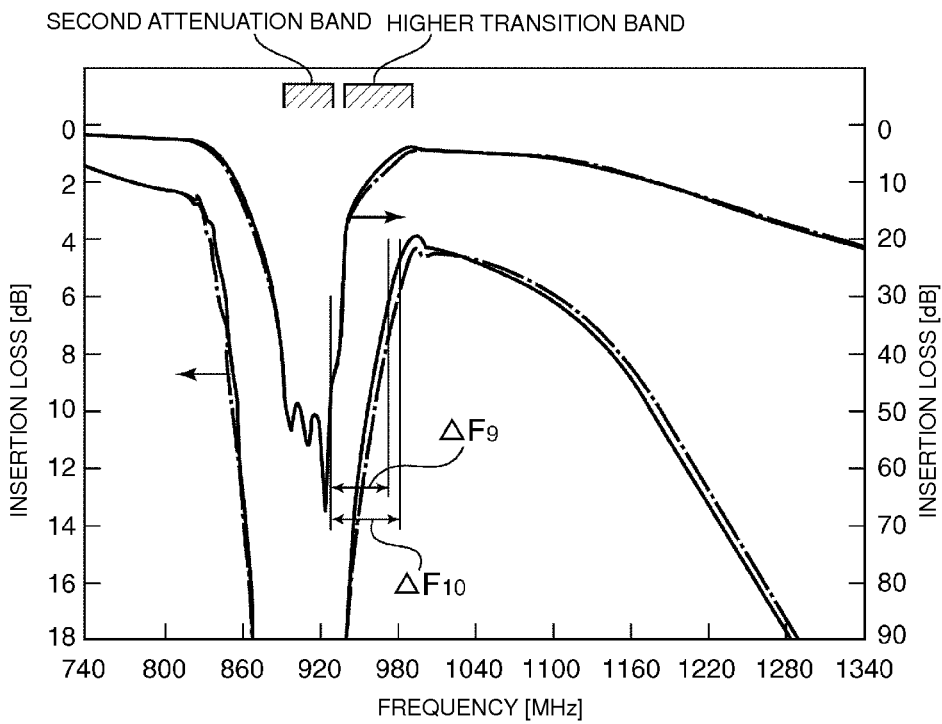
FIG. 23 is a graph illustrating insertion losses of the band rejection filter according to the fifth example and a band rejection filter according to a fifth comparative example.

FIG. 23 shows results of the measurement of the insertion losses of the band rejection filter according to the fifth example and the band rejection filter according to a fifth comparative example. Note that solid lines in a graph shown in FIG. 23 represent insertion loss of the band rejection filter of the fifth example, and dashed lines in the graph shown in FIG. 23 represent insertion loss of the band rejection filter of the fifth comparative example.

As shown in FIG. 23, the band rejection filter of the fifth example has higher sharpness of the filter characteristic in the higher transition band which is located on the higher side relative to the second attenuation band than the band rejection filter of the fifth comparative example. Specifically, as shown in FIG. 23, as a difference (ΔF) between a frequency corresponding to an insertion loss of 6 dB on a higher side relative to the second attenuation band included in a first passband and a frequency corresponding to an insertion loss of 50 dB on a higher side relative to the second attenuation band, 57.5 MHz is obtained in the fifth comparative example (ΔF10) whereas 46.0 MHz is obtained in the fifth example (ΔF9). That is, the frequency difference (ΔF9) of the fifth example is smaller than the frequency difference (ΔF10) of the fifth comparative example by 11.5 MHz.

Consequently, it is recognized that the sharpness of the filter characteristic in the higher transition band which is located on the higher side relative to the second attenuation band can be enhanced by making the propagation angle (ψ) of one of the elastic wave resonators which has the highest resonant frequency among the anti-resonant frequencies of the first and second series arm resonators S1 and S2 and the resonant frequencies of the first and second parallel arm resonators P1 and P2 larger than the propagation angles (ψ) of the others of the elastic wave resonators.

The band rejection filter according to the fifth preferred embodiment is configured such that the second series arm resonator S2 which has the highest frequency among the anti-resonant frequencies of the first and second series arm resonators S1 and S2 and the resonant frequencies of the first and second parallel arm resonators P1 and P2 and which contributes to the formation of the higher transition band located on the higher side relative to the second attenuation band has the propagation angle (ψ=30°) which is larger than the propagation angles (ψ=20°) of the first series arm resonator S1 and the first and second parallel arm resonators P1 and P2. In addition, the propagation angles (ψ) of the first series arm resonator S1 and the first and second parallel arm resonators P1 and P2 are preferably the same as one another. However, the present invention is not restricted to this configuration.

That is, the propagation angles (ψ) of the first series arm resonator S1 and the first and second parallel arm resonators P1 and P2 may be different from one another, or one of the propagation angles (ψ) of the first series arm resonator S1 and the first and second parallel arm resonators P1 and P2 may be the same as the propagation angle (ψ) of the second series arm resonator S2.

Even in a case where the propagation angles (ψ) of the first and second series arm resonators S1 and S2 and the first and second parallel arm resonators P1 and P2 are different from one another, or a case where the propagation angle (ψ) of at least one of the first and second series arm resonators S1 and S2 and the first and second parallel arm resonators P1 and P2 is different from the propagation angles (ψ) of the others of the first and second series arm resonators S1 and S2 and the first and second parallel arm resonators P1 and P2, the electromechanical coupling coefficient ($k^2$) of the elastic wave resonator which has the highest frequency among the anti-resonant frequencies of S1 and S2 and the resonant frequencies of P1 and P2 and which contributes to the formation of the transition band is smaller than the electromechanical coupling coefficients ($k^2$) of the other elastic wave resonators by setting the propagation angle (ψ) of the elastic wave resonator which has the highest frequency among the antiresonant frequencies of the series arm resonators and the resonant frequencies of the parallel arm resonators and which contributes to the formation of the transition band to be larger than the propagation angles (ψ) of the other elastic wave resonators. Accordingly, as with the fifth preferred embodiment, the sharpness of the impedance characteristic of the elastic wave resonator which has the highest resonant frequency and which contributes to the formation of the transition band is enhanced, and the sharpness of the filter characteristic in the higher transition band which is located on the higher side relative to the second attenuation band is enhanced.

Furthermore, even in a case where the propagation angles (ψ) of the first and second series arm resonators S1 and S2 and the first and second parallel arm resonators P1 and P2 are different from one another, or a case where the propagation angle (ψ) of at least one of the first and second series arm resonators S1 and S2 and the first and second parallel arm resonators P1 and P2 is different from the propagation angles (ψ) of the others of the first and second series arm resonators S1 and S2 and the first and second parallel arm resonators P1 and P2, the electromechanical coupling coefficient ($k^2$) of the elastic wave resonator which has the highest frequency and which contributes to the formation of the transition band is smaller than at least one of the electromechanical coupling coefficients ($k^2$) of the other elastic wave resonators by setting the propagation angle (ψ) of the elastic wave resonator which has the highest frequency and which contributes to the formation of the transition band to be larger than any one of the propagation angles (ψ) of the other elastic wave resonators. Accordingly, as with the fifth preferred embodiment, the sharpness of the impedance characteristic of the elastic wave resonator which has the highest frequency and which contributes to the formation of the transition band is enhanced, and the sharpness of the filter characteristic in the higher transition band which is located on the higher side relative to the second attenuation band is enhanced.

Sixth Preferred Embodiment

Figure 24:
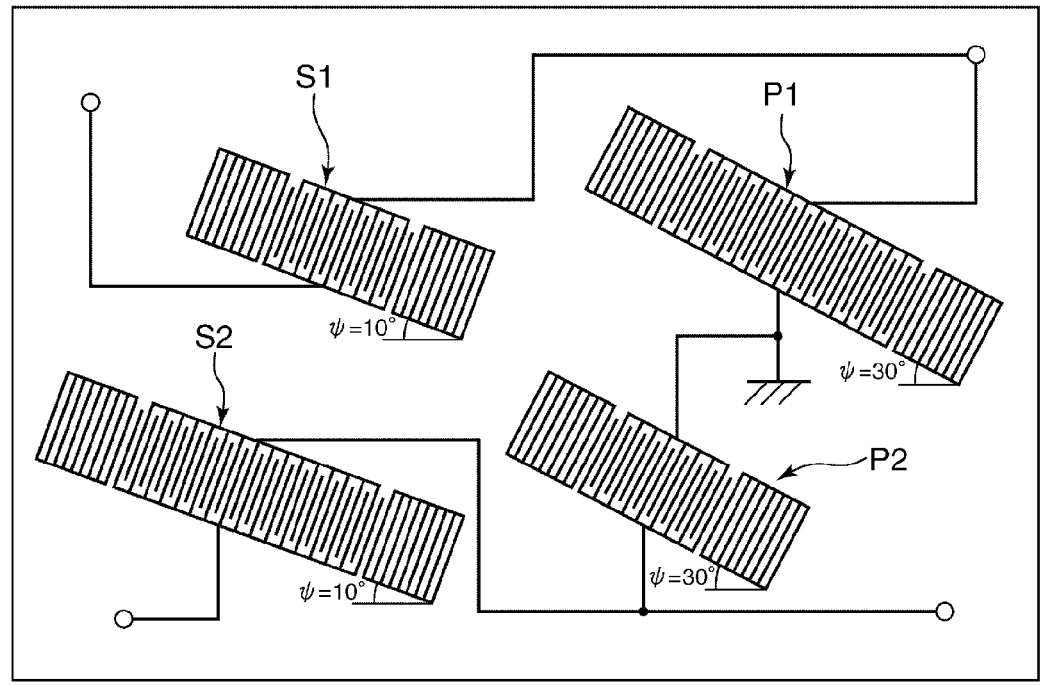
FIG. 24 is a plan view schematically illustrating an elastic wave element according to a sixth preferred embodiment of the present invention.

FIG. 24 is a plan view schematically illustrating an elastic wave element according to a sixth preferred embodiment. As shown in FIG. 24, the band rejection filter according to the sixth preferred embodiment is configured similarly to the band rejection filter according to the second preferred embodiment shown in FIG. 8 except for propagation angles (ψ) of first and second series arm resonators S1 and S2 and first and second parallel arm resonators P1 and P2.

Therefore, the band rejection filter according to the sixth preferred embodiment has first attenuation bands in which an insertion loss is large. The first attenuation bands are respectively formed on a lower side and a higher side. The lower first attenuation band is mainly formed by capacitances of the first and second series arm resonators S1 and S2. The higher first attenuation band is mainly formed by inductances of first to third inductance elements 40 to 42 and capacitances of the first and second parallel arm resonators P1 and P2.

The band rejection filter of the sixth preferred embodiment has a first passband which is located between the lower first attenuation band and the higher first attenuation band and in which an insertion loss is small. The first passband is mainly formed by the inductances of the first to third inductance elements 40 to 42.

The band rejection filter of the sixth preferred embodiment has a second attenuation band which is included in the first passband and in which an insertion loss is large. The second attenuation band is mainly formed by attenuation poles generated due to antiresonances of the first and second series arm resonators S1 and S2 and attenuation poles generated due to resonances of the first and second parallel arm resonators P1 and P2.

The band rejection filter of the sixth preferred embodiment has a second passband which is included in the first passband, which is located on a lower side relative to the second attenuation band, and in which an insertion loss is small. The second passband is mainly formed by the inductances of the first to third inductance elements 40 to 42.

Then, the band rejection filter of the sixth preferred embodiment has a lower transition band between the second attenuation band and the second passband and a higher transition band on a higher side relative to the second attenuation band.

As shown in FIG. 24, in this preferred embodiment, propagation angles (ψ=30°) of the first and second parallel arm resonators P1 and P2 are larger than propagation angles (ψ=10°) of the first and second series arm resonators S1 and S2. Therefore, electromechanical coupling coefficients ($k^2$) of the first and second parallel arm resonators P1 and P2 are smaller than electromechanical coupling coefficients ($k^2$) of first and second series arm resonators S1 and S2. As a result, high sharpness of a filter characteristic in the higher transition band which is located on the higher side relative to the second attenuation band is realized.

Furthermore, also in this preferred embodiment, the propagation angles (ψ) of the first and second parallel arm resonators P1 and P2 are equal to or smaller than 45° and are larger than the propagation angles (ψ) of the first and second series arm resonators S1 and S2. Therefore, a TCF of the filter characteristic in the higher transition band which is located on the higher side relative to the second attenuation band is small. Accordingly, also when the band rejection filter of this preferred embodiment is used, a large fabrication tolerance regarding frequencies is obtained, and a high fabrication yield rate is realized.

SIXTH EXAMPLE AND SIXTH COMPARATIVE EXAMPLE

A band rejection filter according to a sixth example corresponding to the sixth preferred embodiment is fabricated preferably by a method the same as the method for fabricating the band rejection filter of the first example. Note that, in the sixth example, detailed configurations of first and second series arm resonators S1 and S2 and first and second parallel arm resonators P1 and P2 are as shown in Table 6 below.

TABLE 6

| | S1 | P1 | P2 | S2 |
|---|---|---|---|---|
| Number of pairs of electrode fingers in the IDTs (pair) | 160 | 45 | 85 | 130 |
| Number of pairs of electrode fingers in the reflectors (pair) | 16.5 | 16.5 | 16.5 | 16.5 |
| wavelength λ (μm) | 2.5768 | 2.4965 | 2.4682 | 2.5882 |
| cross width (μm) | 160 | 45 | 85 | 130 |
| IDT duty ratio | 0.64 | 0.64 | 0.64 | 0.64 |
| reflector duty ratio | 0.64 | 0.64 | 0.64 | 0.64 |
| propagation angle ψ (°) | 10 | 30 | 30 | 10 |

A band rejection filter according to a sixth comparative example is fabricated similarly to the sixth example except that all propagation angles ($\psi$) of first and second series arm resonators S1 and S2 and first to second parallel arm resonators P1 and P2 of the sixth comparative example are set to 10°.

Next, impedance characteristics (resonant frequencies and anti-resonant frequencies) of the first and second series arm resonators S1 and S2 and the first to second parallel arm resonators P1 and P2 of the band rejection filter according to the sixth example are individually measured.

In the band rejection filter of this preferred embodiment that is configured such that first to third inductance elements 40 to 42 and the first and second series arm resonators S1 and S2 are arranged in a series arm 10 and the first and second parallel arm resonators P1 and P2 are arranged in first and second parallel arms 13a and 13b, respectively, an elastic wave resonator having the highest frequency among anti-resonant frequencies of the first and second series arm resonators S1 and S2 and resonant frequencies of the first and second parallel arm resonators P1 and P2 contributes to formation of a higher transition band located on a higher side relative to a second attenuation band. Sharpness of a filter characteristic in the higher transition band located on the higher side relative to the second attenuation band is determined by frequency characteristics of the parallel arm resonators, specifically, by the resonant frequencies and anti-resonant frequencies of the parallel arm resonators.

Figure 25:
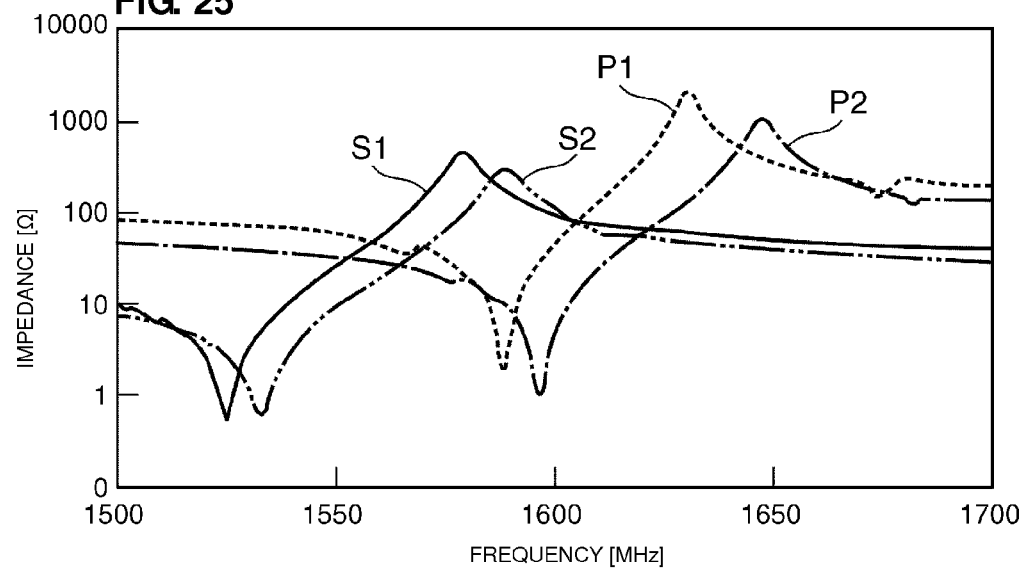
FIG. 25 is a graph illustrating impedance characteristics of series arm resonators and parallel arm resonators according to a sixth example.

FIG. 25 shows impedance characteristics of the first and second series arm resonators S1 and S2 and the first and second parallel arm resonators P1 and P2 of the band rejection filter according to the sixth example. In FIG. 25, a solid line denoted by a reference symbol S1 represents the impedance characteristic of the first series arm resonator S1. A chain double-dashed line denoted by a reference symbol S2 represents the impedance characteristic of the second series arm resonator S2. A dotted line denoted by a reference symbol P1 represents the impedance characteristic of the second parallel arm resonator P1. A dashed line denoted by a reference symbol P2 represents the impedance characteristic of the third parallel arm resonator P2.

In the sixth example, as shown in FIG. 25, when the anti-resonant frequencies of the first and second series arm resonators S1 and S2 and the resonant frequencies of the first and second parallel arm resonators P1 and P2 are compared with one another, the resonant frequency of the second parallel arm resonator P2 is the highest frequency. Therefore, when the resonant frequency of the first parallel arm resonator P1 is compared with the resonant frequency of the second parallel arm resonator P2, the resonant frequency of the second parallel arm resonator P2 is higher. Consequently, it is recognized that a frequency characteristic of the second parallel arm resonator P2 contributes the most to the filter characteristic in the higher transition band which is located on the higher side relative to the second attenuation band, and a frequency characteristic of the first parallel arm resonator P1 contributes the second most to the filter characteristic in the higher transition band.

Figure 26:
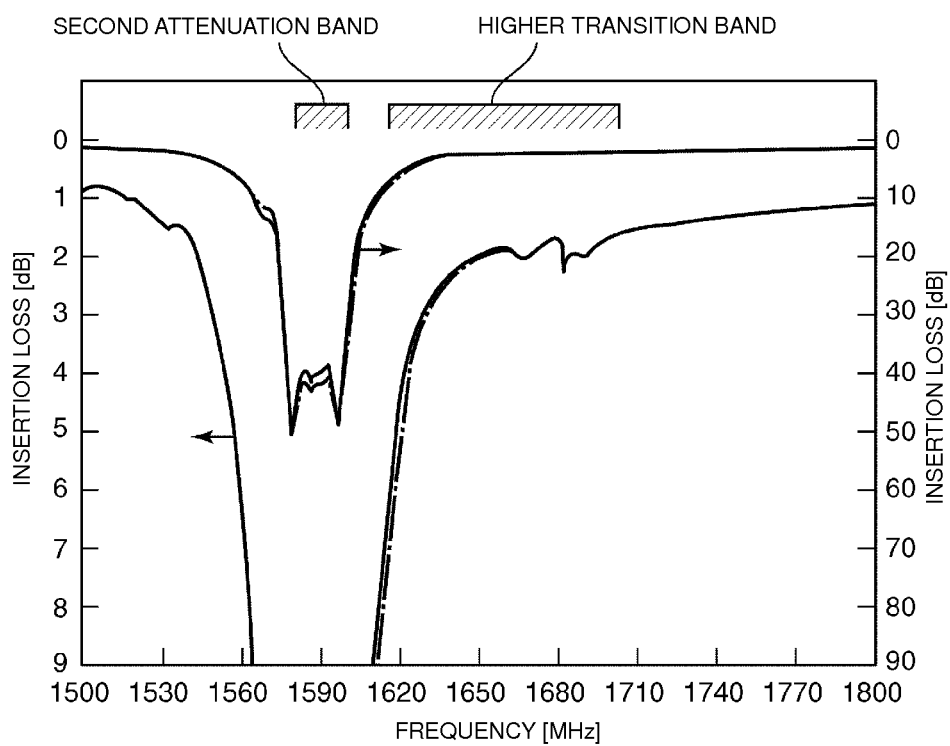
FIG. 26 is a graph illustrating insertion losses of the band rejection filter according to the sixth example and a band rejection filter according to the sixth comparative example.
Figure 27:
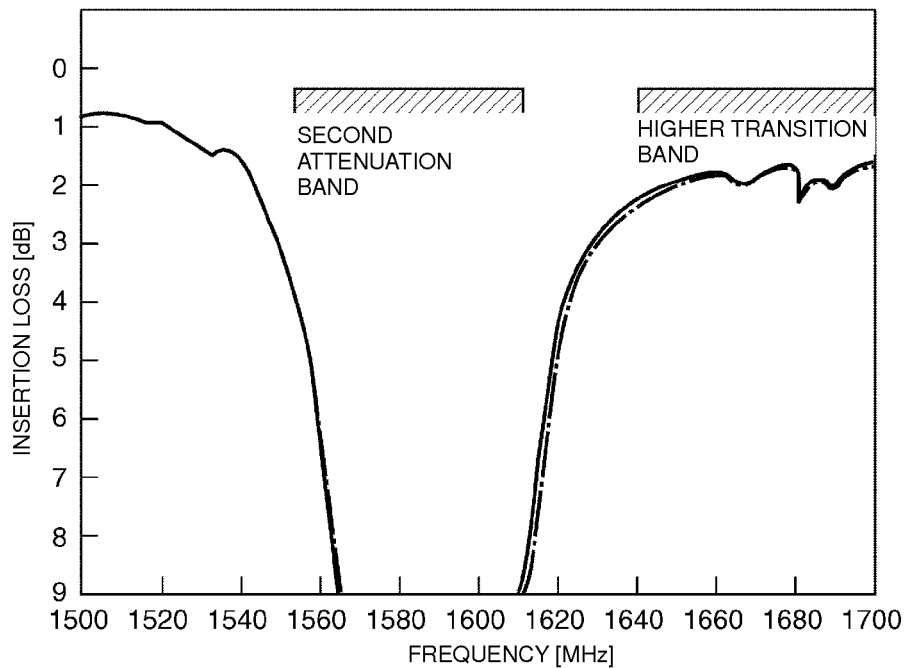
FIG. 27 is a graph illustrating the insertion losses of the band rejection filter according to the sixth example and the band rejection filter according to the sixth comparative example.

An insertion loss of the obtained band rejection filter of the sixth example and an insertion loss of the obtained band rejection filter of the sixth comparative example are measured. Results of the measurement are shown in FIGS. 26 and 27. FIG. 27 is a graph obtained by enlarging a portion of a graph shown in FIG. 26. Note that, in FIGS. 26 and 27, solid lines of the graph represent insertion losses of the band rejection filter of the sixth example, and dashed lines in the graph represent insertion loss of the band rejection filter of the sixth comparative example.

As shown in FIGS. 26 and 27, the sharpness of the filter characteristic in the higher transition band which is located on the higher side relative to the second attenuation band of the band rejection filter according to the sixth example is higher than the sharpness of the filter characteristic in the higher transition band of the band rejection filter according to the sixth comparative example. Consequently, it is recognized that the sharpness of the filter characteristic in the higher transition band which is located on the higher side relative to the second attenuation band can be enhanced by making the propagation angles ($\psi$) of the first and second parallel arm resonators P1 and P2 larger than the propagation angles ($\psi$) of the first and second series arm resonators S1 and S2.

Figure 28:
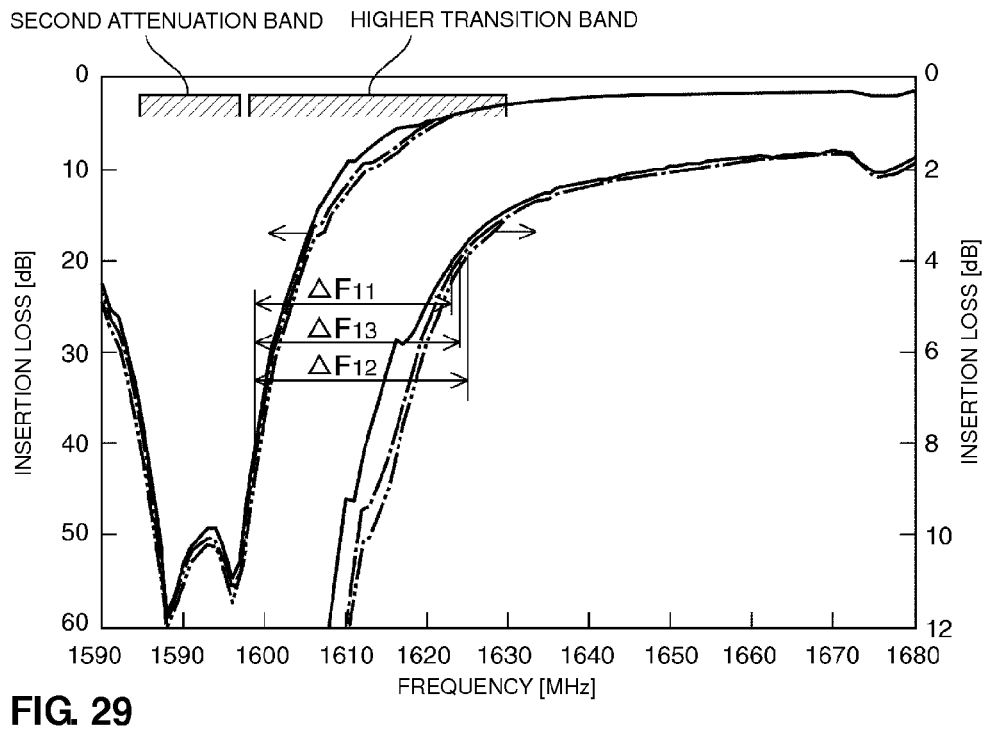
FIG. 28 is a graph illustrating insertion losses of the band rejection filter according to the sixth example, the band rejection filter according to the sixth comparative example, and a band rejection filter in which only the propagation angles ($\psi$) of the parallel arm resonators of the sixth example are changed.
Figure 29:
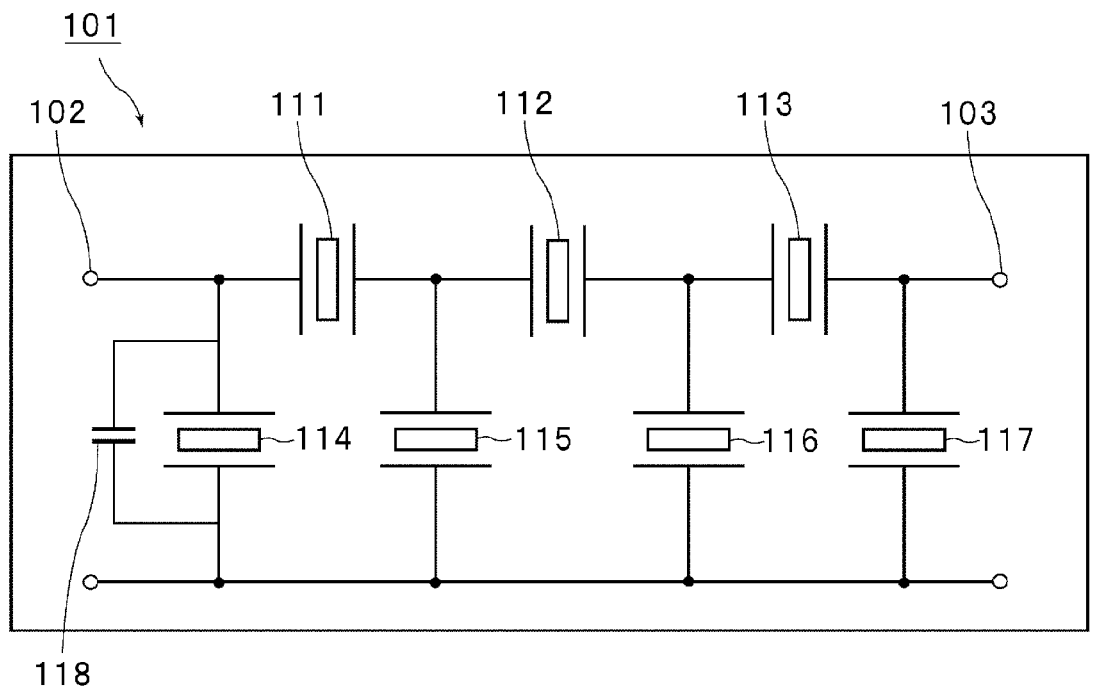
FIG. 29 is a circuit diagram illustrating a filter device disclosed in Japanese Patent No. 3827232.

FIG. 28 shows insertion losses of the band rejection filter according to the sixth example, the band rejection filter according to the sixth comparative example, and a band rejection filter in which only the propagation angles ($\psi$) of the parallel arm resonators of the sixth example are changed. Specifically, dashed lines in a graph shown in FIG. 28 represent insertion losses of the band rejection filter in which the propagation angle ($\psi$) of the first parallel arm resonator P1 is 10° which is the same as those of the first and second series arm resonators S1 and S2. Note that solid lines in the graph shown in FIG. 28 represent insertion losses of the band rejection filter according to the sixth example. Chain double-dashed lines in the graph shown in FIG. 28 represent insertion losses of the band rejection filter according to the sixth comparative example.

Consequently, as shown in FIG. 28, frequency characteristics of the first and second parallel arm resonators P1 and P2 contribute the filter characteristic in the higher transition band located on the higher side relative to the second attenuation band. It is recognized that especially the sharpness of the filter characteristic in the higher transition band located on the higher side relative to the second attenuation band can be enhanced by making the propagation angles ($\psi$) of the first and second parallel arm resonators P1 and P2 larger than the propagation angle ($\psi$) of the first and second series arm resonators S1 and S2.

Specifically, as shown in FIG. 28, as a difference ($\Delta F$) between a frequency corresponding to an insertion loss of 4 dB on a lower side relative to a higher passband and a frequency corresponding to an insertion loss of 40 dB on a higher side relative to the attenuation band, 24.5 MHz is obtained in the sixth example ($\Delta F11$), 25.7 MHz MHz is obtained in the sixth comparative example ($\Delta F12$), and 25.0 MHz is obtained in the band rejection filter ($\Delta F13$) in which only the propagation angle ($\psi$) of the first parallel arm resonator P1 among the first and second parallel arm resonators P1 and P2 is set to 10° which is the same as those of the first and second series arm resonators S1 and S2.

Note that the reason that the sharpness of the filter characteristic in the higher transition band located on the higher side relative to the second attenuation band can be enhanced by making the propagation angles ($\psi$) of the first and second parallel arm resonators P1 and P2 larger than the propagation angles ($\psi$) of the first and second series arm resonators S1 and S2 is the same as the reason in the third example.

That is, as is apparent from FIG. 16, when a large propagation angle ($\psi$) of an elastic resonator is set so that a small electromechanical coupling coefficient ($k^2$) of the elastic wave resonator is obtained, a resonant frequency and an anti-resonant frequency of the elastic wave resonator are close to each other. Therefore, sharpness of an impedance characteristic is enhanced. Accordingly, the sharpness of the filter characteristic in the higher transition band located on the higher side relative to the second attenuation band can be enhanced by making the propagation angles ($\psi$) of the first and second parallel arm resonators P1 and P2 larger than the propagation angles (ψ) of the first and second series arm resonators S1 and S2.

In the band rejection filter of the sixth preferred embodiment, the first parallel arm resonator P1 which has the highest resonant frequency among the anti-resonant frequencies of the first and second series arm resonators S1 and S2 and the resonant frequencies of the first and second parallel arm resonators P1 and P2 and which contributes to the formation of the higher transition band located on the higher side relative to the second attenuation band and the second parallel arm resonator P2 have the propagation angles (ψ=30°) larger than the propagation angles (ψ=10°) of the first and second series arm resonators S1 and S2, and the propagation orientations (ψ) of the first and second series arm resonators S1 and S2 are the same as each other. However, the present invention is not limited to this configuration.

That is, the propagation angles (ψ) of the first and second series arm resonators S1 and S2 may be different from each other, or one of the propagation angles (ψ) of the first and second series arm resonators S1 and S2 may be the same as the propagation angles (ψ) of the first and second parallel arm resonators P1 and P2.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A band rejection filter comprising:
   a ladder circuit including:
      a series arm arranged to connect an input terminal and an output terminal to each other;
      a parallel arm which is connected between the series arm and a ground potential;
      a plurality of elastic wave resonators which are disposed in at least one of the series arm and the parallel arm;
      an inductance element which is disposed in at least one of the series arm and the parallel arm; and
      a first attenuation band, a first passband which is provided by an inductance of the inductance element and adjacent to the first attenuation band, a second attenuation band which is provided by resonances of the plurality of elastic wave resonators and included in the first passband, and a transition band which is adjacent to the second attenuation band; wherein
   at least one of the elastic wave resonators which contributes to formation of the transition band has a propagation angle larger than propagation angles of the others of the elastic wave resonators; and
   the at least one of the elastic wave resonators having the propagation angle larger than the propagation angles of the others of the elastic wave resonators includes one of an elastic wave resonator of the plurality of elastic wave resonators which has a lowest resonant frequency and an elastic wave resonator of the plurality of elastic wave resonators which has a highest anti-resonant frequency.

2. The band rejection filter according to claim 1, wherein a plurality of the inductance elements are disposed in the series arm, a plurality of the parallel arms are connected between the series arm and a ground potential, and the elastic wave resonators are disposed respectively in the plurality of the parallel arms.

3. The band rejection filter according to claim 2, wherein at least one of the elastic wave resonators has a resonant frequency different from resonant frequencies of the others of the elastic wave resonators, and the one of the elastic wave resonators which has the lowest resonant frequency has the propagation angle larger than the propagation angle of the others of the elastic wave resonators.

4. The band rejection filter according to claim 1, wherein the plurality of elastic wave resonators are arranged in the series arm, and the inductance element is disposed in the parallel arm.

5. The band rejection filter according to claim 4, wherein at least one of the elastic wave resonators has an anti-resonant frequency different from anti-resonant frequencies of the others of the elastic wave resonators, and the one of the elastic wave resonators which has the highest anti-resonant frequency has the propagation angle larger than the propagation angle of the others of the elastic wave resonators.

6. The band rejection filter according to claim 1, wherein at least one of the elastic wave resonators is arranged in the series arm, at least one of the elastic wave resonators is disposed in the parallel arm, and the inductance element is disposed in at least one of the series arm and the parallel arm.

7. The band rejection filter according to claim 6, wherein one of the elastic wave resonators which has the lowest frequency among an anti-resonant frequency of the at least one of the elastic wave resonators which is arranged in the series arm and a resonant frequency of the at least one of the elastic wave resonators which is arranged in the parallel arm has the propagation angle larger than the propagation angle of the others of the elastic wave resonators.

8. The band rejection filter according to claim 6, wherein the at least one of the elastic wave resonators which is disposed in the series arm has the propagation angle larger than the propagation angle of the at least one of the elastic wave resonator which is disposed in the parallel arm.

9. The band rejection filter according to claim 6, wherein one of the elastic wave resonators having the highest frequency among an anti-resonant frequency of the at least one of the elastic wave resonators which is arranged in the series arm and a resonant frequency of the at least one of the elastic wave resonators which is disposed in the parallel arm has the propagation angle larger than the propagation angle of the others of the elastic wave resonators.

10. The band rejection filter according to claim 6, wherein the at least one of the elastic wave resonators which is disposed in the parallel arm has the propagation angle larger than the propagation angle of the at least one of the elastic wave resonators which is disposed in the series arm.

11. The band rejection filter according to claim 1, wherein the elastic wave resonators are elastic boundary wave resonators.

12. A band rejection filter comprising:
    a ladder circuit including:
       a series arm arranged to connect an input terminal and an output terminal to each other;
       a parallel arm which is connected between the series arm and a ground potential;
       a plurality of elastic wave resonators which are disposed in at least one of the series arm and the parallel arm;
       an inductance element which is disposed in at least one of the series arm and the parallel arm; and
       a first attenuation band, a first passband which is provided by an inductance of the inductance element and adjacent to the first attenuation band, a second attenuation band which is provided by resonances of the plurality of elastic wave resonators included in the first passband, and a transition band which is adjacent to the second attenuation band; wherein at least one of the elastic wave resonators which contributes to formation of the transition band has a propagation angle larger than propagation angle of the others of the elastic wave resonators, and therefore, the at least one of the elastic wave resonators which contributes to the formation of the transition band has an electromechanical coupling coefficient smaller than electromechanical coupling coefficients of the others of the elastic wave resonators; and the at least one of the elastic wave resonators having the propagation angle larger than the propagation angles of the others of the elastic wave resonators includes one of an elastic wave resonator of the plurality of elastic wave resonators which has a lowest resonant frequency and an elastic wave resonator of the plurality of elastic wave resonators which has a highest anti-resonant frequency.

13. The band rejection filter according to claim 12, wherein a plurality of the inductance elements are disposed in the series arm, a plurality of the parallel arms are connected between the series arm and a ground potential, and the elastic wave resonators are disposed respectively in the plurality of the parallel arms.

14. The band rejection filter according to claim 13, wherein at least one of the elastic wave resonators has a resonant frequency different from resonant frequencies of the others of the elastic wave resonators, and the one of the elastic wave resonators which has the lowest resonant frequency has the propagation angle larger than the propagation angle of the others of the elastic wave resonators.

15. The band rejection filter according to claim 12, wherein the plurality of elastic wave resonators are arranged in the series arm, and the inductance element is disposed in the parallel arm.

16. The band rejection filter according to claim 15, wherein at least one of the elastic wave resonators has an anti-resonant frequency different from anti-resonant frequencies of the others of the elastic wave resonators, and the one of the elastic wave resonators which has the highest anti-resonant frequency has the propagation angle larger than the propagation angle of the others of the elastic wave resonators.

17. The band rejection filter according to claim 12, wherein at least one of the elastic wave resonators is arranged in the series arm, at least one of the elastic wave resonators is disposed in the parallel arm, and the inductance element is disposed in at least one of the series arm and the parallel arm.

18. The band rejection filter according to claim 17, wherein one of the elastic wave resonators which has the lowest frequency among an anti-resonant frequency of the at least one of the elastic wave resonators which is arranged in the series arm and a resonant frequency of the at least one of the elastic wave resonators which is arranged in the parallel arm has the propagation angle larger than the propagation angle of the others of the elastic wave resonators.

19. The band rejection filter according to claim 17, wherein the at least one of the elastic wave resonators which is disposed in the series arm has the propagation angle larger than the propagation angle of the at least one of the elastic wave resonator which is disposed in the parallel arm.

20. The band rejection filter according to claim 17, wherein one of the elastic wave resonators having the highest frequency among an anti-resonant frequency of the at least one of the elastic wave resonators which is arranged in the series arm and a resonant frequency of the at least one of the elastic wave resonators which is disposed in the parallel arm has the propagation angle larger than the propagation angle of the others of the elastic wave resonators.

21. The band rejection filter according to claim 17, wherein the at least one of the elastic wave resonators which is disposed in the parallel arm has the propagation angle larger than the propagation angle of the at least one of the elastic wave resonators which is disposed in the series arm.

22. The band rejection filter according to claim 12, wherein the elastic wave resonators are elastic boundary wave resonators.

* * * * *